US012633490B2

(12) United States Patent
Stopka et al.

(10) Patent No.: US 12,633,490 B2
(45) Date of Patent: May 19, 2026

(54) MAGNETIC LENSES, CHARGED PARTICLE MICROSCOPE SYSTEMS INCLUDING THE SAME, AND ASSOCIATED METHODS

(71) Applicant: FEI Company, Hillsboro, OR (US)

(72) Inventors: Jan Stopka, Rašovice (CZ); Tomáš Radlička, Brno (CZ); Martin Oral, Brno (CZ)

(73) Assignee: FEI Company, Hillsboro, OR (US)

( * ) Notice: Subject to any disclaimer, the term of this patent is extended or adjusted under 35 U.S.C. 154(b) by 357 days.

(21) Appl. No.: 18/342,643

(22) Filed: Jun. 27, 2023

(65) Prior Publication Data
US 2025/0006453 A1 Jan. 2, 2025

(51) Int. Cl.
| | |
|---|---|
| *H01J 37/14* | (2006.01) |
| *H01J 37/20* | (2006.01) |
| *H01J 37/21* | (2006.01) |
| *H01J 37/28* | (2006.01) |

(52) U.S. Cl.
CPC .............. *H01J 37/14* (2013.01); *H01J 37/20* (2013.01); *H01J 37/21* (2013.01); *H01J 37/28* (2013.01); *H01J 2237/1035* (2013.01); *H01J 2237/141* (2013.01); *H01J 2237/1415* (2013.01)

(58) Field of Classification Search
CPC .. H01J 37/14; H01J 37/20; H01J 37/21; H01J 37/28; H01J 2237/1035; H01J 2237/141; H01J 2237/1415; H01J 37/141
See application file for complete search history.

(56) References Cited

FOREIGN PATENT DOCUMENTS

CN    115714080 A    2/2023

OTHER PUBLICATIONS

European Patent Office, European Partial Search Report for related European Patent Application No. 24183222.9, Nov. 26, 2024, 13 pages.

*Primary Examiner* — Robert H Kim
(74) *Attorney, Agent, or Firm* — Leron Vandsburger

(57)    ABSTRACT

Magnetic lenses, charged particle microscope systems including the same, and associated methods. In an example, a magnetic lens is configured to direct a charged particle beam to a sample location and comprises a plurality of pole pieces and at least two independent coils. The magnetic lens operates as an objective lens with variable main objective plane without immersing a sample in a magnetic field. The variable main objective plane permits selective adjustment of a magnification of the charged particle beam at the focal plane without immersing the sample location in the magnetic fields produced by coils of the magnetic lens. In an example, a charged particle microscope system comprises a charged particle source, a sample holder, and a magnetic objective lens. In an example, a method comprises positioning a sample relative to a magnetic lens and operating the magnetic lens to focus a charged particle beam to a focus location.

20 Claims, 8 Drawing Sheets

MAGNETIC LENSES, CHARGED PARTICLE MICROSCOPE SYSTEMS INCLUDING THE SAME, AND ASSOCIATED METHODS

FIELD

The present disclosure relates generally to magnetic lenses for charged particle microscope systems and to charged particle microscope systems including such magnetic lenses.

BACKGROUND

Charged particle microscopy is a well-known and increasingly important technique for imaging microscopic objects, particularly in the form of electron microscopy. The basic genus of the electron microscope finds practical application in the form of a variety of apparatus species, such as the Transmission Electron Microscope (TEM), Scanning Electron Microscope (SEM), and Scanning Transmission Electron Microscope (STEM), and also into various sub-species.

In a SEM, irradiation of a specimen by a scanning electron beam precipitates emanation of "auxiliary" radiation from the specimen in the form of secondary electrons, backscattered electrons, X-rays, and cathodoluminescence (infrared, visible and/or ultraviolet photons), for example. One or more components of this emanating radiation is/are then detected and used for image accumulation purposes.

As an alternative to the use of electrons as irradiating beam, charged particle microscopy can also be performed using other species of charged particle. In this respect, the phrase "charged particle" may be understood as encompassing electrons, positive ions (e.g., Ga or He ions), negative ions, protons, and positrons, for example. In addition to imaging and performing (localized) surface modification (e.g., milling, etching, deposition, etc.), a charged particle microscope also may have other functionalities, such as performing spectroscopy, examining diffractograms, etc.

In all cases, a charged particle microscope (CPM) generally will comprise at least a radiation source (e.g., an electron source or ion gun), a beam directing system, a specimen holder, and a detector.

The detector can take many different forms depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations. It generally is desirable that the detector exhibit a sufficiently broad dynamic range to represent a wide range of incident charged particle signal magnitudes.

While the present disclosure generally pertains to the specific context of charged particle microscopy, and more specifically to electron microscopy, such descriptions are not intended to be limiting, and it is within the scope of the present disclosure that the apparatuses and methods disclosed herein may be applied in any suitable context.

SUMMARY

Magnetic lenses, charged particle microscope systems including the same, and associated methods are disclosed herein.

In a representative example, an apparatus comprises a magnetic lens configured to direct a charged particle beam to a sample location in a focal plane. The magnetic lens comprises a plurality of pole pieces defining at least two axial gaps and at least two independent coils in respective communication with the at least two axial gaps and configured to generate magnetic fields such that the magnetic lens operates as a single objective lens with variable main objective plane. The variable main objective plane permits selective adjustment of a magnification of the charged particle beam at the focal plane without immersing the sample location in the magnetic fields produced by coils of the magnetic lens.

In another representative example, a magnetic lens comprises a lens body, a first coil supported by the lens body, and a second coil supported by the lens body. The first coil is configured to generate a first magnetic field and the second coil is configured to generate a second magnetic field. The lens body comprises a central bore configured to receive a charged particle beam passing through the magnetic lens, a first pole piece, a second pole piece, and a third pole piece. The first pole piece extends circumferentially around the central bore. The second pole piece extends circumferentially around the central bore and is at least partially disposed radially exteriorly of the first pole piece. The third pole piece extends circumferentially around the central bore and is at least partially disposed radially exteriorly of the second pole piece.

In another representative example, a charged particle microscope system comprises a charged particle source configured to emit a charged particle beam along an optical axis and toward a sample, a sample holder configured to support the sample, and a magnetic objective lens configured to focus the charged particle beam to a focus location corresponding to a location of the sample. The magnetic objective lens comprises a lens body with a central bore through which the charged particle beam extends, a first coil, and a second coil. The first coil is supported by the lens body and is configured to generate a first magnetic field with a first field magnitude. The second coil is supported by the lens body and is configured to generate a second magnetic field with a second field magnitude. The magnetic objective lens is configured such that adjusting a ratio between the first field magnitude and the second field magnitude operates to adjust a magnification of the magnetic objective lens. The focus location is positioned exteriorly of the lens body, and each of the first magnetic field and the second magnetic field is localized to a region away from the focus location.

In another representative example, a method comprises positioning a sample relative to a magnetic lens and operating the magnetic lens to focus a charged particle beam to a focus location. The magnetic lens comprises a plurality of pole pieces defining at least two axial gaps and at least two independent coils in respective communication with the at least two axial gaps such that the magnetic lens operates as a single objective lens with variable main objective plane.

The foregoing and other objects, features, and advantages of the disclosed technology will become more apparent from the following detailed description, which proceeds with reference to the accompanying figures.

DETAILED DESCRIPTION

The present disclosure generally is directed to magnetic lenses that are configured for use in conjunction with charged particle microscope (CPM) systems to focus one or more charged particle beams upon a sample. As discussed in more detail below, such magnetic lenses can enable selective adjustment of a main objective plane and/or magnification of the charged particle beam without immersing the sample in a magnetic field. Examples can allow for a fixed working distance or focal plane position while providing an adjustable magnification and convergence angle.

Figure 1:
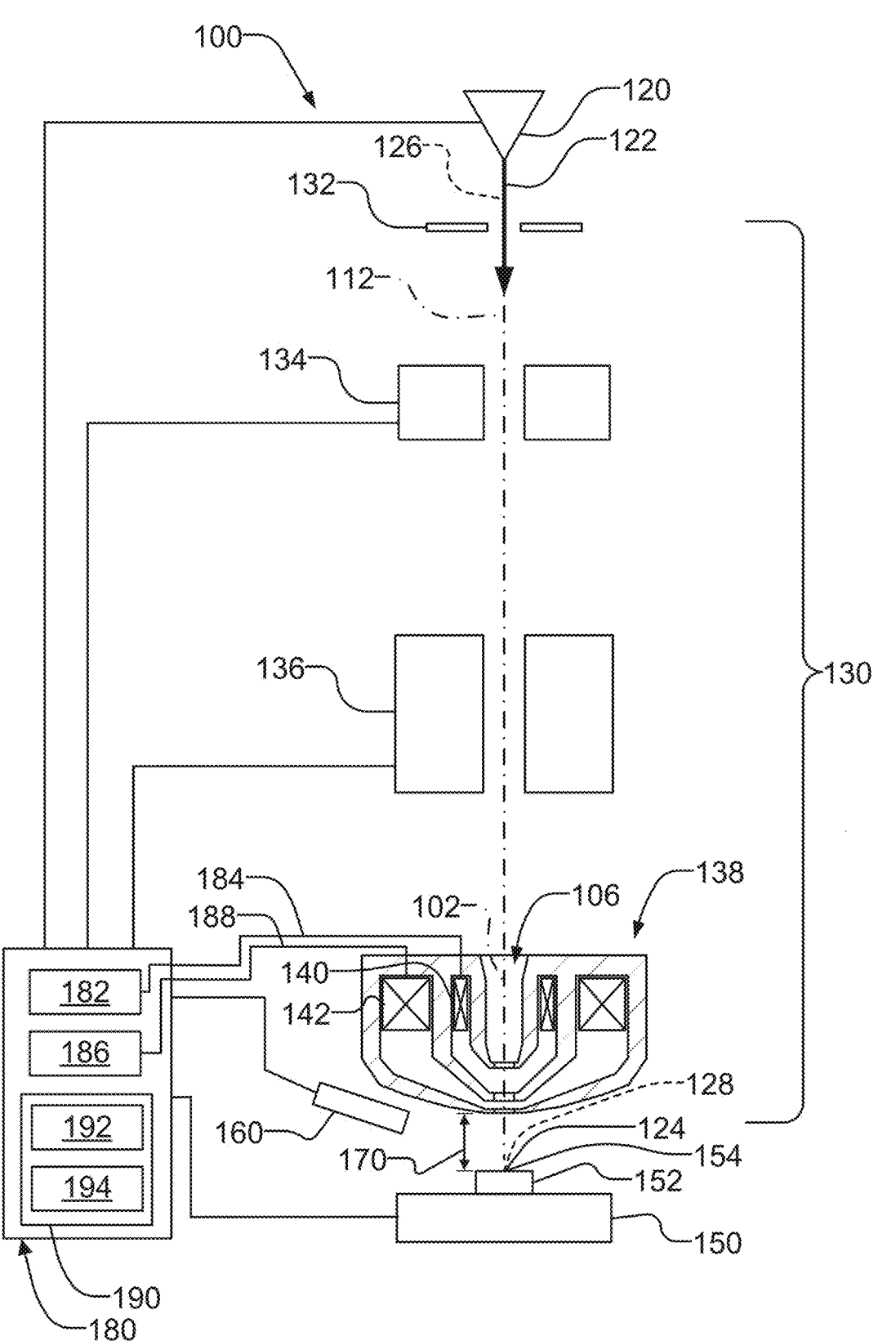
FIG. 1 is a schematic representation of a CPM system that can utilize the magnetic lenses disclosed herein, according to an example.

FIG. 1 is a schematic representation of an example of a charged particle microscope (CPM) system 100. The CPM system 100 can include a charged particle source 120, a sample holder 150 configured to support a sample 152, and a beam directing system 130. The charged particle source 120 can generate and/or emit a charged particle beam 122 along an optical axis 112 toward the sample 152, while the beam directing system 130 can shape, modulate, focus, and/or direct the charged particle beam 122 to the sample 152.

The beam directing system 130 can include any of a variety of components and/or elements for operating upon the charged particle beam 122. For example, and as shown in FIG. 1, the beam directing system 130 can include an aperture 132 configured to limit an angular extent of the charged particle beam 122, a condenser lens 134 configured to converge the charged particle beam 122 toward the sample 154, and/or one or more scan coils 136 configured to deflect the charged particle beam 122. As discussed in more detail below, the beam directing system 130 also includes a magnetic objective lens 138 that operates to direct (e.g., converge and/or focus) the charged particle beam 122 to a focus location 124 upon the sample 152. As shown in FIG. 1, the magnetic objective lens 138 includes a central bore 106 through which the charged particle beam 122 may travel. In various examples, the beam directing system 130 additionally or alternatively can include illuminators, objective lenses, projection lenses, condenser lenses, electrostatic/magnetic lenses, deflectors (e.g., scan coils), correctors (such as stigmators), etc. in any suitable combinations.

The focus location 124 can include, be, and/or correspond to any location (e.g., a point, a region, a line, a plane, a volume, etc.) at which the charged particle beam is sufficiently focused to serve as a probe of the sample 152 as described herein. As example, the focus location 124 can include and/or be a focal point and/or a focal plane associated with the magnetic objective lens 138. Accordingly, as used herein, the focus location 124 additionally or alternatively may be referred to as a focal point 124 and/or as a focal plane 124. In examples in which the focus location 124 is at least a portion of a focal plane, it is to be understood that such a focal plane is not necessary perfectly planar. For example, the focal plane may be subject to field curvature associated with the magnetic objective lens 138.

As discussed in more detail below, the magnetic objective lens 138 can operate to focus the charged particle beam 122 by generating one or more magnetic fields that deflect rays of the charged particle beam 122 toward a common focus location (e.g., the focus location 124). In various examples, and as shown in FIG. 1, the magnetic objective lens 138 includes a first coil 140 configured to generate a first magnetic field and a second coil 142 configured to generate a second magnetic field. For example, each of the first coil 140 and/or the second coil 142 can include and/or be a coil of electrically conductive material (e.g., wire) configured such that passing an electrical current through each coil operates to generate the respective magnetic field.

The magnetic objective lens 138 generally is configured such that the sample 152 is substantially shielded and/or isolated from each of the first magnetic field and the second magnetic field during operative use of the CPM system 100. For example, and as shown in FIG. 1, the CPM system 100 is configured such that the sample holder 150 and the sample 152 are positioned fully exteriorly of the magnetic objective lens 138 during operative use of the CPM system 100. Additionally, and as described in more detail below, the magnetic objective lens 138 has a plurality of pole pieces that are configured to guide and/or localize the first and second magnetic fields toward the central bore 106 and/or away from the sample 152.

The CPM system 100 can represent an example of any of a variety of CPM systems. In particular, the present disclosure generally is directed to examples in which the CPM system 100 includes and/or is a scanning electron microscope (SEM) system in which the charged particle beam 122 is an electron beam 122 that is guided to and focused onto the sample 152 by the beam directing system 130. In such examples, the (focused) electron beam 122 can interact with the sample 152 in such a manner as to cause various types of "stimulated" radiation to emanate from the sample 152, including (for example) secondary electrons, backscattered electrons, X-rays, and/or and optical radiation (cathodoluminescence).

While the present disclosure generally relates to examples in which the CPM system 100 is an SEM system, this is not required of all examples, and it additionally is within the scope of the present disclosure that the systems and apparatuses disclosed herein (e.g., the magnetic objective lens 138) can be used in conjunction with any suitable CPM configuration, examples of which include a transmission electron microscope (TEM), a scanning transmission electron microscope (STEM), a focused ion beam (FIB) system, etc.

As shown in FIG. 1, the CPM system 100 can include an electron detector 160 configured to detect electrons emitted from the sample 152. In particular, the electron detector 160 shown in FIG. 1 may represent a detector for detecting secondary electrons (SE) emitted from the sample 152. It also is within the scope of the present disclosure that the CPM system additionally or alternatively may include electron detectors configured to detect other emissions from the sample 152, such as backscattered electrons (BSE). In this manner, a measurement characterizing the electrons incident upon the electron detector (e.g., characterizing the intensity and/or energy of such detected electrons) can provide an indication of various physical properties of the sample 152, such as a geometrical structure of the sample 152 and/or a chemical composition of the sample 152 at a location upon which the electron beam 122 is incident upon the sample 152 (e.g., at the focus location 124). A spatial resolution with which the CPM system 100 can characterize the sample 152 thus is at least partially based upon a minimum size (e.g., a minimum diameter) of the electron beam 122 in a plane corresponding to a location at which the sample 152 is located.

Scanning the electron beam 122 across a surface of the sample 152 thus can yield an image and/or other representation of the sample 152 in the region scanned. Such scanning may be accomplished in any suitable manner. For example, the scan coils 136 can operate to deflect the electron beam 122 to move the focus location 124 relative to the sample 152. Additionally or alternatively, the sample holder 150 can be configured to rotate and/or translate the sample 152 through one or more dimensions to move the sample 152 relative to the focus location 124. Such translation of the sample 152 and/or scanning of the electron beam 122 thus can allow selected portions of the sample 152 to be irradiated/imaged/inspected by the electron beam 122 traveling along the optical axis 112.

As shown in FIG. 1, the CPM system 100 further can include a controller 180 that is programmed and/or otherwise configured to at least partially control operation of the CPM system 100. For example, the controller 180 can at least partially control operation of the charged particle source 120 to produce the charged particle beam 122 and/or can at least partially control operation of at least a portion of the beam directing system 130. Additionally or alternatively, the controller 180 can receive a signal from the electron detector 160 that is representative of electrons that are emitted from a surface of the sample 152, which may be used to produce an image and/or other representation of the sample 152.

In some examples, the controller 180 also can at least partially control operation of the magnetic objective lens 138, such as by selectively and dynamically varying the first magnetic field and/or the second magnetic field. This may be accomplished by regulating one or more electrical currents that are delivered to the magnetic objective lens 138 to produce magnetic fields. For example, and as shown in FIG. 1, the controller 180 may include a first current source 182 configured to convey a first electrical current 184 to the first coil 140 and a second current source 186 configured to convey a second electrical current 188 to the second coil 142. In such examples, the controller 180 may be configured to selectively vary the first electrical current 184 and/or the second electrical current 188 to adjust a focal plane of the magnetic objective lens 138.

In various examples, the first coil 140 and the second coil 142 are configured to operate independently of one another to produce the corresponding magnetic fields. For example, the first electrical current 184 can be supplied to the first coil 140 alone and the second electrical current 188 can be supplied to the second coil 142 alone, with the first electrical current 184 and the second electrical current 188 being independently and/or separately controlled. In this manner, in the present disclosure, the first coil 140 and the second coil 142 may be described as being independent coils and/or as being separate coils.

As shown in FIG. 1, the controller 180 can include a user interface 190 for receiving inputs from a human user and/or for recording and/or displaying information. In particular, the user interface 190 can include one or more input devices 192 and/or one or more output devices 194. The one or more input devices 192 can include and/or be any suitable devices for receiving inputs form a human user to at least partially direct operation of the CPM system 100, such as a keyboard, a mouse, a display, a touchscreen, etc. The one or more output devices 194 can include and/or be any suitable devices for conveying information to a human user, such as a display, a touchscreen, a physical storage drive, etc.

The controller 180 can include any of a variety of modules (e.g., hardware and/or software) for performing these and other functions. In some examples, the controller 180 is a single device that includes each of the constituent components described herein. In other examples, the controller 80 can refer to and/or encompass a collection of components that may be at least partially spatially separated. The controller 180 can be connected to any other suitable components of the CPM system 100 in any suitable manner, such as via one or more control lines and/or via wireless connections. As examples, such control lines can include and/or be physical signal conduits, such as wires, electrical buses, optical fibers, etc.

Figure 2:
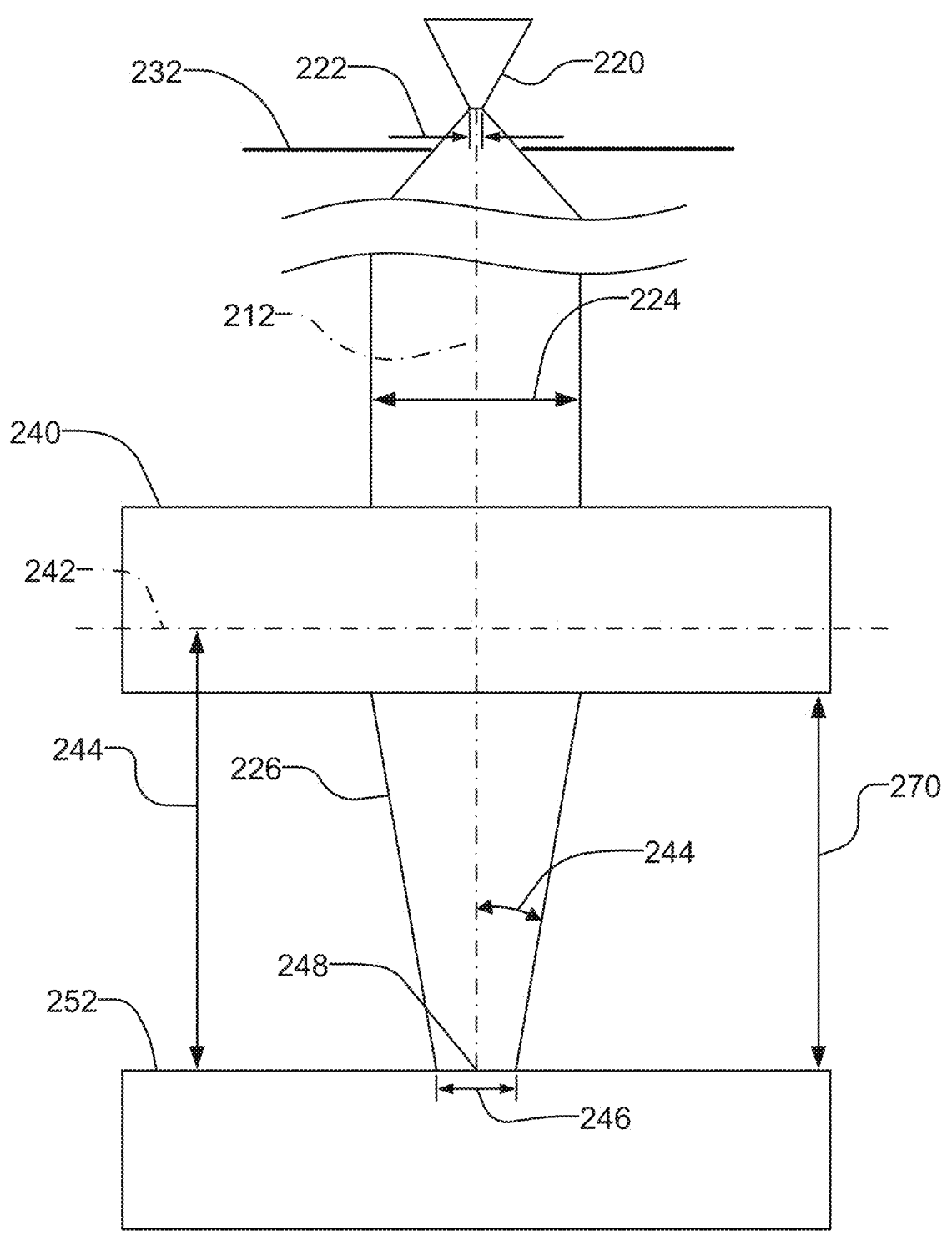
FIG. 2 is a schematic representation of a charged particle beam incident upon a sample according to an example.

FIG. 2 illustrates an example of a charged particle beam 226 that is focused to a focus location 248 on a surface of a sample 252. The charged particle beam 226 may represent an example of the charged particle beam 122 of FIG. 1, and the sample 252 may represent an example of the sample 152 of FIG. 1. As shown in FIG. 2, the charged particle beam 226 may be focused onto the sample 252 by an objective lens 240, which may represent a portion of the beam directing system 130 of FIG. 1 (e.g., the magnetic objective lens 138). In the example of FIG. 2, the sample 252 is spaced apart from the objective lens 240 by a working distance 270.

As shown in FIG. 2, the charged particle beam 226 is emitted by a charged particle beam source 220 and is limited by an aperture 232. The charged particle beam source 220 and the aperture 232 may represent examples of the charged particle source 120 and aperture 132, respectively, of FIG. 1. The charged particle beam 226 may be characterized by a first beam diameter 224 upstream of and/or at the objective lens 240. The charged particle beam 226 additionally may be characterized by a focused beam diameter 246 at the focus location 248.

Together with the charged particle beam source 220 and other optical elements (not shown in FIG. 2) preceding the objective lens 240, the objective lens 240 can operate to define an optical magnification of the optical column, i.e., a magnification of the charged particle beam 226 from a charged particle beam source diameter 222 at the charged particle beam source 220 to the focused beam diameter 246 at the focus location 248. For example, the ratio of the focused beam diameter 246 to the charged particle beam source diameter 222 can correspond to this magnification.

The charged particle beam 226 also may be characterized by a beam convergence angle 244 (or "aperture angle"), which may be measured between an optical axis 212 and an outer extent of the beam envelope, and/or by a focal distance 260 that represents a distance along the optical axis 212 between a main objective plane 242 of the objective lens 240 and the focus location 248. Specifically, as used herein, the main objective plane 242 of the objective lens 240 refers to a plane spatially associated with the objective lens 240 (e.g., at least partially within the objective lens 240) from which the focal distance 260 is measured. In general, the optical magnification of the optical column determines the convergence angle 244, which also can be associated with the focal distance 260. In this manner, adjusting the objective lens 240 to vary the location of the main objective plane 242 also operates to adjust the focal distance 260, the convergence angle 244, and the optical magnification of the optical column. Such adjustments also can be made while maintaining a fixed working distance 270 between the structure of the objective lens 240 and the sample 252.

As discussed above, it generally is desirable that the focused beam diameter 246 be as small as possible to maximize a spatial resolution of the associated CPM system. In practice, however, optical phenomena such as spherical aberrations, chromatic aberrations, astigmatism, diffraction, etc., contribute to undesirable increases in the ideal obtainable beam width of the charged particle beam 226 downstream of the objective lens 240, including at the focus location 248. Accordingly, the focus location 248 can refer to and/or correspond to a location (e.g., a plane perpendicular to the optical axis 212) at which the charged particle beam 226 has a minimum diameter (e.g., the focused beam diameter 246) and/or at which a spatial density of rays representing the charged particle beam 226 reaches a maximum. The total of the various contributions to the undesirable increases beam width at focus can be minimized by selection of an optimized value for the convergence angle 244. Thus, because optical column magnification determines the convergence angle 244, selective variation of the optical column magnification can allow selection of the convergence angle 244 that provides the smallest focused beam diameter 246.

In practice, the objective lens 240 can operate to adjust the focal distance 260, which in turn can adjust the optical column magnification and the focused beam diameter 246. In this manner, adjusting the focal distance 260 can operate to adjust the defined magnification of the optical column between the charged particle beam source and the sample 252. In some examples, the focused beam diameter 246 may depend upon the focal distance 260 in such a manner that the focused beam diameter 246 reaches a minimum value at a specific corresponding focal distance 260, which in some examples may be referred to as an optimized value of the focal distance 260.

In some examples, the SEM system may be configured to focus each of a plurality of charged particle beams onto the sample. For example, and with reference to FIG. 1, the charged particle beam 122 may be a first charged particle beam 122, the focus location 124 may be a first focus location 124, and the beam directing system 130 further may be configured to direct a second charged particle beam 126 to a second focus location 128 on the sample 152 that is adjacent to the first focus location 124. In some examples, the first focus location 124 and the second focus location 128 are located within a common focal plane that extends perpendicular to the optical axis 112. In such examples, a distance separating the first focus location 124 and the second focus location 128 (e.g., along a direction perpendicular to the optical axis 112 and/or parallel to a surface of the sample 152) may be described as a beam pitch of the CPM system 100. In such examples, the CPM system 100 also may be referred to as a multi-beam CPM system 100 and/or as a multi-beam SEM system 100.

In some traditional examples of CPM systems, adjusting a magnification of the beam directing system can be important because it also can operate to adjust a beam pitch of a multi-probe pattern of the charged particle beams (or "beamlets") incident upon the sample. Accordingly, in some examples, one or more condenser lenses (e.g., the condenser lens 134 of FIG. 1) can be used to adjust the aperture angle and/or total magnification of the charged particle beam. In some examples, however, such as in a multi-beam SEM system, the trajectory of the charged particle beam may be constrained in order to mitigate and/or minimize the effect of aberrations of the condenser lenses. In such examples, it may be impractical to adjust the aperture angle and/or total magnification of the charged particle beam with condenser lenses in this manner.

As another example, in some traditional examples of CPM systems, a focal length of the objective lens can also be adjusted, but such a focal length may be measured relative to a generally fixed position of a main objective plane of the objective lens. This leads to variation in the position of the focal plane along the optical axis 212 (e.g., relative to the objective lens) as the focal length is varied. In some such examples, a stage supporting the sample (e.g., the sample holder 150 of FIG. 1) can be used to adjust the working distance by moving the sample to the newly positioned focal plane. Such adjustment, however, may undesirably affect the quality of the signal. For example, moving the sample to a large working distance may result in only a few signal electrons being detectable with in-column detectors. Alternatively, moving the sample to a smaller working distance can occlude in-chamber detectors. Moreover, in some examples, the transmission detection of a multi-beam SEM requires a fixed working distance.

To allow for variation of the focal distance at a constant working distance, the objective lens of a CPM system can include and/or be a compound magnetic lens with a high-resolution lens and an immersion objective lens that can be adjusted independently of one another to shift the plane of focus of the charged particle beam. In particular, in such examples, varying a ratio between the respective magnitudes of the magnetic fields generated by the high-resolution lens and the immersion objective lens can shift the location of the main objective plane of the objective lens, and thus can adjust the magnification of the beam directing system. Such examples generally require that the sample be exposed to (e.g., immersed in) the magnetic field generated by the immersion objective lens, which may be undesirable. For example, the use of an immersion magnetic field in this manner may be unsuitable for use with magnetically sensitive samples, and such configurations may limit the range of usable working distances. Additionally, in some examples, the respective magnetic fields generated by the high-resolution lens and the immersion objective lens may overlap only in a complex manner that introduces undesirable aberrations, thereby limiting the resolution of the CPM system.

By contrast, the magnetic objective lenses of the present disclosure can enable adjustment of a main objective plane in a similar manner as traditional compound magnetic lenses without exposing the sample to significant magnetic fields generated by the lenses. In this manner, the magnetic objective lenses of the present disclosure may be particularly well suited for use with magnetically sensitive samples and/or in CPM systems such as multi-beam SEM systems with significant geometrical and/or optical constraints.

In the present disclosure, an object and/or a location (e.g., a sample and/or a location thereof) may be described as being "immersed" in a magnetic field when the magnetic field extends to, through, and/or around the object and/or location, such as with a magnetic field amplitude that is at least 75% of a maximum amplitude of the magnetic field, at least 50% of the maximum amplitude of the magnetic field, at least 30% of the maximum amplitude of the magnetic field, at least 20% of the maximum amplitude of the magnetic field, at least 10% of the maximum amplitude of the magnetic field, at least 5% of the maximum amplitude of the magnetic field, at least 2% of the maximum amplitude of the magnetic field, at least 1% of the maximum amplitude of the magnetic field, at least 0.5% of the maximum amplitude of the magnetic field, at least 0.1% of the maximum amplitude of the magnetic field, and/or at least 0.01% of the maximum amplitude of the magnetic field. For example, a traditional immersion objective lens may generate a magnetic field at a sample location that is about 30%-100% of a maximum amplitude of the magnetic field.

Similarly, in the present disclosure, an object and/or a location may be described as being at least substantially isolated from a magnetic field, as being at least substantially shielded from the magnetic field, and/or as not being immersed in the magnetic field, when the magnetic field extends to, through, and/or around the object and/or location only with a magnetic field amplitude that is less than 50% of a maximum amplitude of the magnetic field, less than 40% of the maximum amplitude of the magnetic field, less than 30% of the maximum amplitude of the magnetic field, less than 20% of the maximum amplitude of the magnetic field, less than 10% of the maximum amplitude of the magnetic field, less than 5% of the maximum amplitude of the magnetic field, less than 2% of the maximum amplitude of the magnetic field, less than 1% of the maximum amplitude of the magnetic field, less than 0.5% of the maximum amplitude of the magnetic field, less than 0.1% of the maximum amplitude of the magnetic field, and/or less than 0.01% of the maximum amplitude of the magnetic field. For example, magnetic lenses according to the present disclosure may be configured to generate a magnetic field at a sample location that is about 0.07%-5% of a maximum amplitude of the magnet field when the sample location is positioned at a working distance of about 6 millimeters (mm). When the working distance is shortened, the magnetic field at the sample location may be about 0.6%-40% of the maximum field amplitude. When the working distance is extended to about 10 mm, the magnetic field at the sample location may be about 0.02%-3% of the maximum field amplitude. In all such examples, a sample positioned at the sample location may be described as being at least substantially isolated from a magnetic field, as being at least substantially shielded from the magnetic field, and/or as not being immersed in the magnetic field.

In some examples, the maximum amplitude of the magnetic field may correspond to a maximum amplitude of the field in free space (e.g., exterior of a magnet component, a coil, a pole piece, etc. associated with the magnet). Additionally or alternatively, in some examples, the maximum amplitude of the magnetic field may correspond to a maximum amplitude of the field in an interior region of a component producing the magnetic field, such as within the central bore 106 of the magnetic objective lens 138 discussed above.

Figure 3:
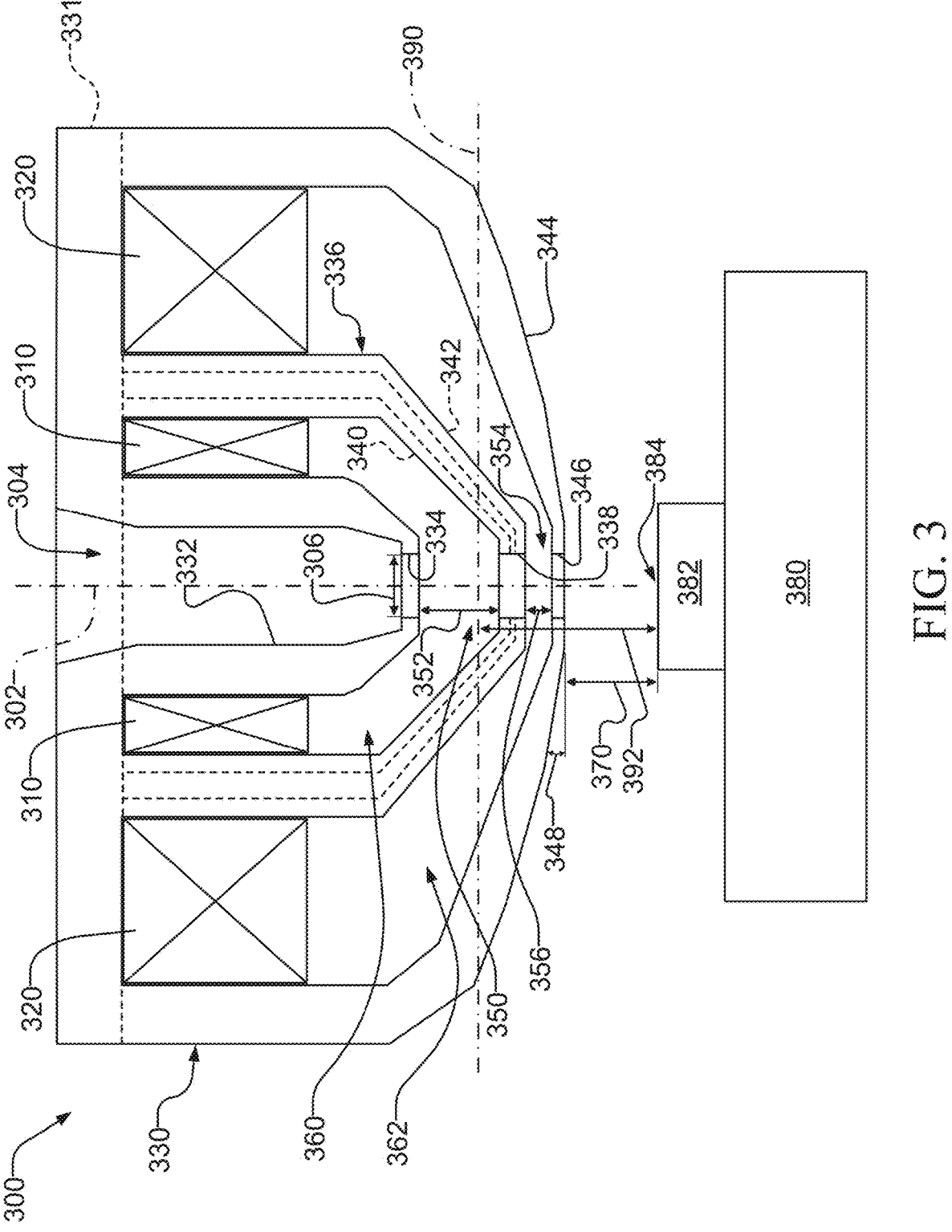
FIG. 3 is a schematic representation of a magnetic lens according to an example.

FIG. 3 illustrates an example of a magnetic lens 300, which may be an example of the magnetic objective lens 138 of FIG. 1 and/or the objective lens 240 of FIG. 2. As shown in FIG. 3, the magnetic lens 300 includes a lens body 330 that defines a central bore 304 of the magnetic lens 300. The central bore 304 may be described as defining and/or extending along a central axis 302 of the magnetic lens 300. For example, the lens body 330 may be at least substantially axially symmetric about the central axis 302 and may define the central bore 304 such that a charged particle beam (e.g., the charged particle beam 122 of FIG. 1) can travel through the central bore 304. In particular, in some examples, the charged particle beam can travel through the lens body 330 along an optical axis (e.g., the optical axis 112 of FIG. 1 and/or the optical axis 212 of FIG. 2) that is parallel to and/or collinear with the central axis 302. in some examples, the charged particle beam can include a plurality of beamlets.

With reference to FIG. 3, the magnetic lens 300 generally is configured to focus a charged particle beam onto a sample 382, which may be supported by a sample holder 380 of a CPM system. The sample 382 may represent the sample 152 of FIG. 1 and/or the sample 252 of FIG. 2. Similarly, the sample holder 380 may represent the sample holder 150 of FIG. 1. In particular, the magnetic lens 300 is configured to generate one or more magnetic fields that deflect the charged particles of the charged particle beam to direct and/or focus the charged particle beam to a localized region of the sample 382 and/or to a sample location 384 at which the sample 382 is located. In an example in which the charged particle beam comprises a plurality of beamlets, the magnetic lens 300 can be configured to direct the beamlets to respective spaced-apart focus locations on the sample 382 and/or at the sample location 384.

In some examples, the sample location 384 may correspond to a focus location of the charged particle beam (e.g., the focus location 124 of FIG. 1 and/or the focus location 248 of FIG. 2). Additionally or alternatively, the sample location 384 may correspond to a location (e.g., a plane) at which the charged particle beam reaches a minimum characteristic beam size (e.g., a minimum beam width or diameter) and/or an optimal focus condition. In this manner, as used herein, the sample location 384 may represent a location (e.g., a point and/or a plane) at which the sample 382 and/or a portion thereof (e.g., an exposed surface of the sample 382) may be positioned during operative use of the magnetic lens 300, regardless of whether the sample 382 is positioned at the sample location 384.

As shown in FIG. 3, the magnetic lens 300 is configured such that the sample location 384 and/or the focus location of the magnetic lens 300 are positioned fully exteriorly of the lens body 330. Accordingly, the magnetic lens 300 is configured such that the sample 382 may be positioned fully exteriorly of the magnetic lens 300 during operative use of the magnetic lens 300.

In the present disclosure, the sample location 384 and/or the focus location of the charged particle beam may be represented and/or quantified in any suitable manner. For example, and as shown in FIG. 3, a configuration of the magnetic lens 300 and/or of a CPM system including the magnetic lens 300 may be characterized with reference to a working distance 370 separating the lens body 330 and the sample location 384.

As shown in FIG. 3, the working distance 370 may represent a minimum distance between a portion of the lens body 330 and the sample location 384 as measured along a direction parallel to the central axis 302. More specifically, the working distance 370 may be defined as a minimum distance between a first plane perpendicular to the central axis 302 that is tangent to the lens body 330 and a second plane perpendicular to the central axis 302 that is tangent to (or includes) the sample location 384. In this manner, the working distance 370 of the magnetic lens 300 may be defined even when the sample 382 is not present.

The working distance 370 may assume any of a variety of values, such as may be associated with an overall size of an associated CPM system and/or associated with a magnification of the magnetic lens 300. As examples, the working distance 370 may be at least 1 millimeter (mm), at least 5 mm, at least 10 mm, at least 15 mm, at least 20 mm, at most 25 mm, at most 17 mm, at most 12 mm, at most 7 mm, and/or at most 2 mm. The working distance 370 additionally or alternatively may be adjustable through any suitable range of values, such as a range of values that encompasses and/or includes one or more of the aforementioned values.

Additionally or alternatively, a configuration of the magnetic lens 300 and/or of a CPM system including the magnetic lens 300 may be characterized with reference to a focal length of the magnetic lens 300. In particular, and as shown in FIG. 3, the magnetic lens 300 can define a main objective plane 390, and thus can be characterized by a focal length 392 separating the main objective plane 390 and sample location 384 as measured along a direction parallel to the central axis 302.

The focal length 392 also may assume any of a variety of values, such as may be at least partially determined by a desired magnification of the magnetic lens 300. As examples, the focal length 392 may be at least 1 mm, at least 5 mm, at least 10 mm, at least 15 mm, at least 20 mm, at most 25 mm, at most 17 mm, at most 12 mm, at most 7 mm, and/or at most 2 mm. The focal length 392 additionally or alternatively may be adjustable through any suitable range of values, such as a range of values that encompasses and/or includes one or more of the aforementioned values.

As shown in FIG. 3, the magnetic lens 300 includes a first coil 310 and a second coil 320, each of which is supported by the lens body 330. The first coil 310 is configured to generate a first magnetic field and the second coil 320 is configured to generate a second magnetic field, each of which can act upon (e.g., exert a Lorentz force upon) the particles of the charged particle beam traveling through the magnetic lens 300 to focus the charged particle beam upon the sample 382. The first coil 310 and the second coil 320 of FIG. 3 may represent examples of the first coil 140 and the second coil 142, respectively, of FIG. 1.

In various examples, the magnetic lens 300 is configured such that, when the magnetic lens 300 generates each of the first magnetic field and the second magnetic field, the first magnetic field and the second magnetic field overlap (e.g., spatially) to form a total magnetic field that is a sum of the first magnetic field and the second magnetic field. In particular, the first magnetic field may be characterized by a first field magnitude at each point in space around the first coil 310 and the second magnetic field may be characterized by a second field magnitude at each point in space around the second coil 320. Thus, the total magnetic field may be characterized by a total field magnitude at each point in space around the first coil 310 and the second coil 320 that is a sum of the first field magnitude and the second field magnitude at that point. The first magnetic field and the second magnetic field may be at least partially overlapping within the central bore 304 of the magnetic lens 300 such that a charged particle beam passing through the central bore 304 is focused by the total magnetic field.

In various examples, characteristics and/or operation of the magnetic lens 300 may be described in terms of the first magnetic field alone, the second magnetic field alone, the first magnetic field and the second magnetic field, and/or the total magnetic field. Unless stated otherwise, descriptions referencing the first magnetic field, the second magnetic field, and/or the total magnetic field generally pertain to examples in which the referenced magnetic field has a nonzero magnitude.

Similar to traditional magnetic lenses, the magnetic lens 300 can be configured to selectively adjust the focal length 392 and/or a location of the focus location of the charged particle beam via adjustment of a ratio of the first field magnitude of the first magnetic field and the second field magnitude of the second magnetic field.

As described in more detail below, the lens body 330 generally is configured to localize the total magnetic field away from the sample location 384. In particular, the lens body 330 can be configured such that, when the magnetic lens 300 operates to generate the total magnetic field, the charged particle beam passing through the lens body 330 is subject to the each of the first magnetic field and the second magnetic field, while each of the first magnetic field and the second magnetic field are confined and/or localized to a region away from the sample location 384. In this manner, the magnetic lens 300 may be configured to adjust a position of the main objective plane 390 through adjustment of the ratio of the first field magnitude to the second field magnitude. This can thus enable adjustment of the magnification of an optical system including the magnetic lens 300 while allowing the working distance 370 to remain unchanged (or to change by a small amount) and while shielding and/or isolating the sample 382 from the total magnetic field. Stated differently, the magnetic lens 300 may be configured such that the sample 382 is at least substantially isolated from each of the first magnetic field and the second magnetic field during operative use while retaining the ability to selectively adjust aperture angle and optical column magnification without using an immersion lens. Accordingly, the magnetic lens 300 may be used in conjunction with magnetically sensitive samples and/or samples that otherwise would be ill-suited for use with an immersion magnetic lens.

The magnetic lens 300 may be configured to localize the total magnetic field to any suitable degree to yield a relatively small and/or negligible magnetic field at the sample location 384. In some examples, the localization of the total magnetic field may be characterized and/or quantified via a comparison of the respective magnitudes of the magnetic fields within the central bore 304 and at the sample location 384. For example, the total magnetic field may be characterized by a maximum focusing field amplitude that represents a maximum amplitude of the total magnetic field at any point within the central bore 304, and a magnitude of the total magnetic field as measured at the sample location 384 may be at most 5% of the maximum focusing field amplitude, at most 2% of the maximum focusing field amplitude, at most 1% of the maximum focusing field amplitude, at most 0.5% of the maximum focusing field amplitude, and/or at most 0.1% of the maximum focusing field amplitude.

The lens body 330 can have any suitable structure and/or configuration for localizing the total magnetic field as described herein. For example, and as shown in FIG. 3, the lens body 330 can include a first pole piece 332, a second pole piece 336, and a third pole piece 344, each of which extends at least partially circumferentially around the central bore 304. The second pole piece 336 can be at least partially disposed radially exteriorly of the first pole piece 332, and the third pole piece 344 can be at least partially disposed radially exteriorly of the second pole piece 336.

In the example of FIG. 3, the first coil 310 is disposed between the first pole piece 332 and the second pole piece 336, while the second coil 320 is disposed between the second pole piece 336 and the third pole piece 344. Accordingly, in this example, the second pole piece 336 is positioned between (e.g., radially between) the first pole piece 332 and the third pole piece 344. Thus, in the present disclosure, the first pole piece 332 also may be referred to as an inner pole piece 332, the second pole piece 336 also may be referred to as an intermediate pole piece 336, and/or the third pole piece 344 also may be referred to as an outer pole piece 344.

The first pole piece 332, the second pole piece 336, and/or the third pole piece 344 may be configured to shape and/or guide first magnetic field and/or the second magnetic field in any suitable manner. In particular, the first pole piece 332 and the second pole piece 336 may be configured to guide the first magnetic field toward the central bore 304, while the second pole piece 336 and the third pole piece 344 may be configured to guide the second magnetic field toward the central bore 304.

In various examples, each of the first pole piece 332, the second pole piece 336, and/or the third pole piece 344 may be formed of a magnetic material (e.g., a ferromagnetic material such as iron) that operates to concentrate and/or direct each of the first magnetic field and/or the second magnetic field. For example, relative to the spatial distributions of the first and/or second magnetic fields in the absence of such pole pieces, the first pole piece 332, the second pole piece 336, and/or the third pole piece 344 may operate to concentrate magnetic field lines associated with the first and/or second magnetic fields therein, thereby reducing a spatial extent of such magnetic fields exterior of the lens body 330.

As discussed above, the magnetic lens 300 may be configured such that the first magnetic field and the second magnetic field are at least partially spatially overlapping. In particular, the magnetic lens 300 may be configured such that the first pole piece 332, the second pole piece 336, and the third pole piece 344 collectively form a portion of a common magnetic circuit associated with each of the first magnetic field and the second magnetic field. Stated differently, when the first magnetic field and the second magnetic field each are nonzero, the total magnetic field may be characterized by magnetic field lines that extend through each of the first pole piece 332, the second pole piece 336, and the third pole piece 344.

This common magnetic circuit (e.g., as represented by the magnetic field lines of the total magnetic field) further can extend between the pole pieces and/or into the central bore 304. For example, and as shown in FIG. 3, the first pole piece 332 and the second pole piece 336 can define a first field region 360 therebetween, which may represent a region in which the first magnetic field is predominantly located. Similarly, the second pole piece 336 and the third pole piece 344 can define a second field region 362 therebetween, which may represent a region in which the second magnetic field is predominantly located.

In such examples, the common magnetic circuit extending through the first pole piece 332, the second pole piece 336, and the third pole piece 344 further may extend through each of the first field region 360 and the second field region 362. Additionally or alternatively, the first pole piece 332 and the second pole piece 336 may be configured to guide the first magnetic field through the first field region 360 to the central bore 304, and/or the second pole piece 336 and the third pole piece 344 may be configured to guide the second magnetic field through the second field region 362 to the central bore 304.

As discussed above, the total magnetic field produced by the magnetic lens 300 represents the sum of the first magnetic field generated by the first coil 310 and the second magnetic field generated by the second coil 320, each of which in turn is at least partially shaped by the first pole piece 332, the second pole piece 336, and/or the third pole piece 344. Accordingly, when the magnetic lens 300 operates to produce each of the first magnetic field and the second magnetic field, the magnetic field at any given location within or around the magnetic lens 300 generally does not represent the first magnetic field alone or the second magnetic field alone, but instead represents the sum of these fields.

Thus, in the present disclosure, while descriptions of components or regions as shaping or containing the first (or second) magnetic field may be understood as pertaining primarily to the first (or second) magnetic field, it is to be recognized that such descriptions also may pertain to the second (or first) magnetic field at such locations. Stated differently, while the present disclosure includes descriptions that refer to components or regions with reference to the first magnetic field or the second magnetic field alone, it is to be understood that such descriptions pertain more generally to corresponding components of the total magnetic field and/or to the total magnetic field itself.

The first field region 360 and/or to the second field region 362 can have any of a variety of forms, shapes, and/or configurations. For example, and as shown in FIG. 3, the first field region 360 and/or the second field region 362 may be open to and/or coextensive with the central bore 304. Additionally or alternatively, the second field region 362 may be separate from the first field region 360, for example such that the first field region 360 and the second field region 362 are connected to one another only via the central bore 304. In the example of FIG. 3, the first field region 360 extends between and/or is bounded by the first coil 310 and the central bore 304, and the second field region 362 extends between and/or is bounded by the second coil 320 and the central bore 304.

FIG. 3 represents an example in which each of the first coil 310, the second coil 320, the first pole piece 332, the second pole piece 336, and the third pole piece 344 extends fully circumferentially around the central axis 302. This is not required of all examples, however, and it additionally is within the scope of the present disclosure that the first pole piece 332, the second pole piece 336, and/or the third pole piece 344 can extend only partially around the central axis 302.

In the example of FIG. 3, each of the first pole piece 332, the second pole piece 336, and the third pole piece 344 at least partially defines the central bore 304. In particular, in this example, the first pole piece 332 terminates at a first terminal edge region 334, the second pole piece 336 terminates at a second terminal edge region 338, and the third pole piece 344 terminates at a third terminal edge region 346.

In this example, each of the first terminal edge region 334, the second terminal edge region 338, and the third terminal edge region 346 includes and/or is a generally annular surface that partially defines the central bore 304. In such examples, each of the first terminal edge region 334, the second terminal edge region 338, and the third terminal edge region 346 additionally or alternatively may be described to as including, being, and/or defining a central aperture of the respective pole piece.

As shown in FIG. 3, the central bore 304 may be characterized by a bore diameter 306 as measured along a direction perpendicular to the central axis 302. In some examples, the bore diameter 306 may correspond to a diameter (e.g., a minimum diameter) of the first terminal edge region 334, the second terminal edge region 338, and/or the third terminal edge region 346.

In the example of FIG. 3, the respective diameters of the first terminal edge region 334, the second terminal edge region 338, and the third terminal edge region 346 are approximately equal to one another, and the bore diameter 306 is illustrated with respect to the first terminal edge region 334. This is not required of all examples, however, and it additionally is within the scope of the present disclosure that two or more of the first terminal edge region 334, the second terminal edge region 338, and the third terminal edge region 346 have different respective diameters. In such examples, the bore diameter 306 may correspond to the smallest of the respective diameters of the first terminal edge region 334, the second terminal edge region 338, and the third terminal edge region 346. In some examples, the respective diameters of the first terminal edge region 334, the second terminal edge region 338, and the third terminal edge region 346 differ from one another by at most 20%.

The bore diameter 306 may assume any suitable value, such as value that is sufficiently large to permit the charged particle beam to pass through the central bore 304 and/or sufficiently small to not significantly attenuate the magnitude of the total magnetic field along the central axis 302. As examples, the bore diameter 306 may be at least 0.1 mm, at least 0.5 mm, at least 1 mm, at least 5 mm, at most 10 mm, at most 2 mm, at most 0.7 mm, and/or at most 0.2 mm.

The lens body 330 also may be characterized with reference to axial offsets of the first pole piece 332, the second pole piece 336, and/or the third pole piece 344 relative to one another along the direction of the central axis 302. For example, and as shown in FIG. 3, the first terminal edge region 334 and the second terminal edge region 338 may be separated by a first pole piece gap 350, while the second terminal edge region 338 and the third terminal edge region 346 may be separated by a second pole piece gap 354.

The first pole piece gap 350 may be described as being in communication with the first coil 310, such as via the first field region 360. Stated differently, the first field region 360 may extend continuously between the first coil 310 and the first pole piece gap 350. Similarly, the second pole piece gap may be described as being in communication with the second coil 320, such as via the second field region 362. Stated differently, the second field region 362 may extend continuously between the second coil 320 and the second pole piece gap 354.

As shown in FIG. 3, the first pole piece gap 350 has a first gap width 352, while the second pole piece gap has a second gap width 356. In this example, each of the first gap width 352 and the second gap width 356 is measured along a direction parallel to the central axis 302.

The first pole piece gap 350 and the second pole piece gap 354 may have any suitable configurations and/or relative dimensions. As examples, a ratio of the first gap width 352 to the second gap width 356 may be at least 1:10, at least 1:5, at least 1:2, at least 1:1, at least 2:1, at least 5:1, at most 10:1, at most 5:1, at most 2:1, at most 1:1, at most 1:2, at most 1:5, and/or at most 1:10.

Additionally or alternatively, and as shown in FIG. 3, each of the first pole piece gap 350 and the second pole piece gap 354 may face the central axis 302. In such an example, each of the first pole piece gap 350 and the second pole piece gap 354 may be described as an axial gap. Stated differently, in such examples, the first terminal edge region 334 and the second terminal edge region 338 may be spaced apart from one another primarily along a direction parallel to the central axis 302, and the second terminal edge region 338 and the third terminal edge region 346 similarly may be spaced apart from one another primarily along a direction parallel to the central axis 302. Such a configuration thus may be described in contrast with an alternative example in which the second terminal edge region and the third terminal edge region are approximately equidistant from a plane of the sample location as measured along the central axis, in which case a gap between the terminal edge regions of the second and third pole pieces may be described as facing the sample. It is to be understood, however, that such an alternative configuration also is within the scope of the present disclosure. In particular, while such a configuration may operate to direct an immersion magnetic field toward and/or to the sample, such a configuration may yield improved characteristics (e.g., stronger lensing with less coil current) relative to a traditional immersion lens that lacks a third pole piece.

As shown in FIG. 3, the third pole piece 344 can be positioned between the sample 382 and each of the first pole piece 332 and the second pole piece 336 during operative use of the magnetic lens 300. Stated differently, the lens body 330 can be configured such that the third pole piece 344 is proximate the sample 382 and/or the sample location 384 relative to each of the first pole piece 332 and the second pole piece 336. In this manner, the third pole piece 344 can operate to shield and/or isolate the sample 382 from magnetic fields that otherwise would reach the sample 382 if the third pole piece 344 were omitted.

In some examples, and as shown in FIG. 3, the third pole piece 344 can be characterized by a taper angle 348, as measured between a surface (e.g., an exterior surface) of the third pole piece 344 proximate to the central bore 304 and/or the third terminal edge region 346 and a direction perpendicular to the central axis 302. Such a taper angle 348 may assume any of a variety of values, examples of which include 0 degrees, at least 1 degree, at least 5 degrees, at least 10 degrees, at least 20 degrees, at least 30 degrees, at most 45 degrees, at most 25 degrees, at most 15 degrees, at most 7 degrees, and/or at most 3 degrees.

In various examples, and as shown in FIG. 3, the second pole piece 336 is a monolithic pole piece that extends continuously between the first field region 360 and the second field region 362. In this manner, for example, a magnetic field line extending between the first field region 360 and the second field region 362 through the second pole piece 336 may remain within the material of the second pole piece 336 at all points between the first field region 360 and the second field region 362.

This is not required of all examples, however, and it additionally is within the scope of the present disclosure that the second pole piece 336 may include a plurality of spaced apart pole piece segments. For example, and as illustrated in dashed lines in FIG. 3, the second pole piece 336 may include a first intermediate pole piece segment 340 and a second intermediate pole piece segment 342 that is at least partially spaced apart from the first intermediate pole piece segment 340. In such examples, the first pole piece 332 and the first intermediate pole piece segment 340 can be configured to guide the first magnetic field toward the central bore 304, while the second intermediate pole piece segment 342 and the third pole piece 344 may be configured to guide the second magnetic field toward the central bore 304.

In some examples, the magnetic lens 300 may be configured such that each of the first intermediate pole piece segment 340 and the second intermediate pole piece segment 342 forms a portion of a common magnetic circuit that additionally includes each of the first pole piece 332 and the third pole piece 344.

As discussed above, the lens body 330 generally is configured such that the first pole piece 332, the second pole piece 336, and the third pole piece 344 are at least partially spaced apart from one another, such as by the first pole piece gap 350, the second pole piece gap 354, the first field region 360, and/or the second field region 362. It also is within the scope of the present disclosure, however, that two or more of the first pole piece 332, the second pole piece 336, and the third pole piece 344 are connected to one another in various manners.

For example, in some examples, two or more of the first pole piece 332, the second pole piece 336, and the third pole piece 344 may be integrally formed with one another. As an example, the lens body 330 may include and/or be a monolithic unit that includes two or more of the first pole piece 332, the second pole piece 336, and the third pole piece 344 as respective portions thereof.

Additionally or alternatively, in some examples, two or more of the first pole piece 332, the second pole piece 336, and the third pole piece 344 may be formed separately and operatively connected and/or attached to one another. For example, and as shown in dashed lines in FIG. 3, the lens body 330 may include a pole piece connection base 331 to which two or more of the first pole piece 332, the second pole piece 336, and the third pole piece 344 are operatively coupled, such as via bonding, welding, fasteners, etc. In other examples, such as when two or more of the first pole piece 332, the second pole piece 336, and the third pole piece 344 may be integrally formed with one another, the pole piece connection base 331 may represent a portion of the lens body 330 that extends between and interconnects such pole pieces.

Moreover, in some examples, two or more of the first pole piece 332, the second pole piece 336, and the third pole piece 344 may be fully spaced apart and/or disconnected from one another. For example, in some such examples, two or more such pole pieces may be spaced apart from one another such that every magnetic field line of a common magnetic circuit including the pole pieces must traverse free space (e.g., vacuum, air, or another ambient environment) to extend between the pole pieces in question.

FIGS. 4-7 illustrate distributions and magnitudes of the total magnetic field produced by magnetic lenses according to the present disclosure at various respective magnitudes of the first and second magnetic fields. In particular, each of FIGS. 4-7 may be understood as representing the magnetic fields produced for a given value of the first electrical current that is delivered to the first coil and a given value of the second electrical current that is delivered to the second coil.

Figure 4:
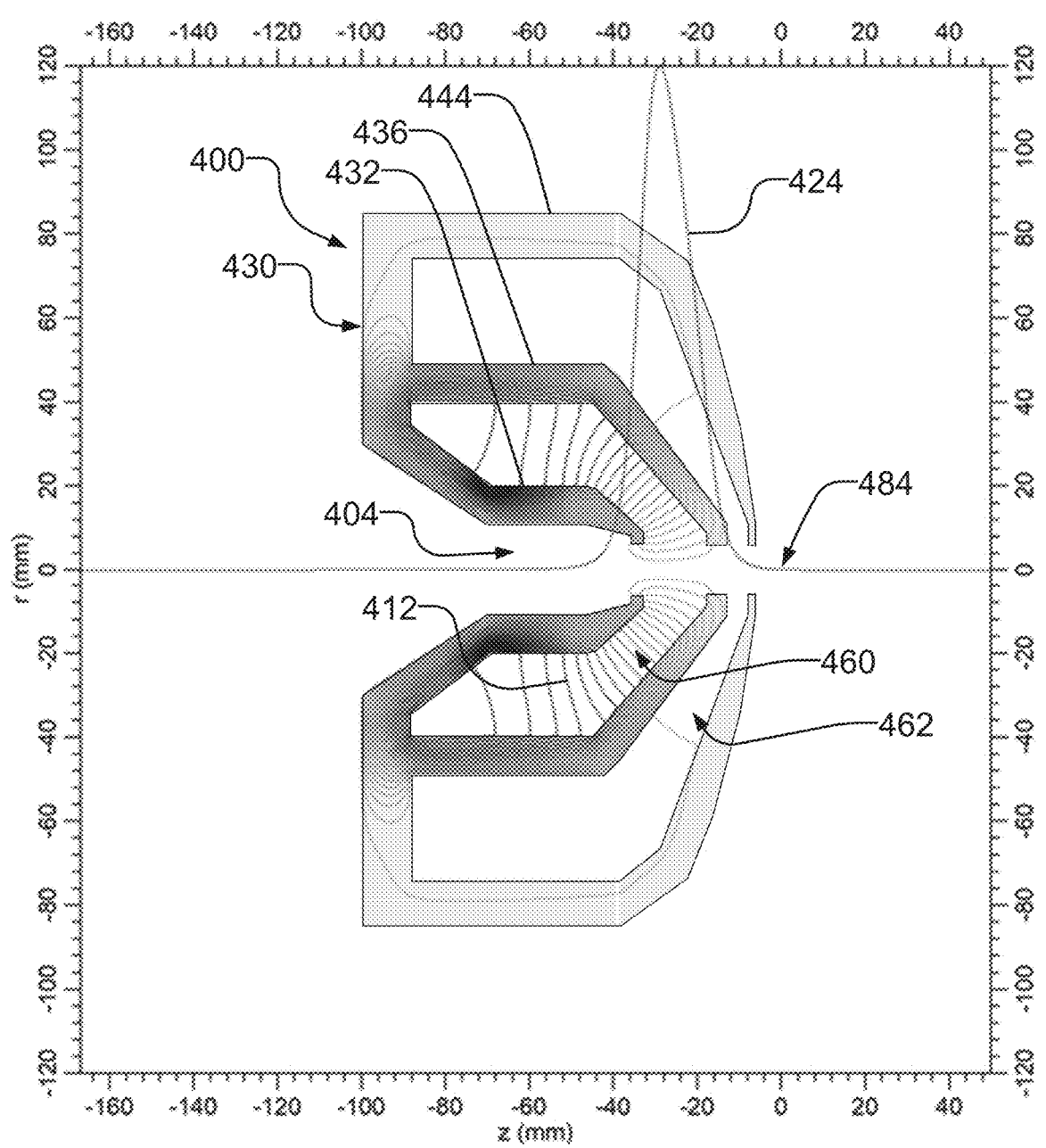
FIG. 4 is a schematic representation of a first magnetic field, a second magnetic field, and a magnitude of total magnetic field generated by a magnetic lens according to a first example.

In each of FIGS. 4-7, various components of the magnetic lenses are labeled with reference numerals analogous to those shown in FIG. 3. In particular, various components labeled with numerals of the form "NXX" in FIGS. 4-7, with N representing the Figure number, may be understood as representing examples of the corresponding components labeled "3XX" in FIG. 3. Thus, for example, FIG. 4 illustrates a magnetic lens 400 with a first pole piece 432, a second pole piece 436, and a third pole piece 444, which may be regarded as analogous to and/or as examples of the first pole piece 332, the second pole piece 336, and the third pole piece 344, respectively, of FIG. 3. It thus is to be understood that such components of FIGS. 4-7 may share any suitable features, characteristics, configurations, etc. of the corresponding components of FIG. 3, even when such components are not specifically discussed with reference to FIGS. 4-7.

Additionally, FIGS. 4-7 illustrate magnetic field lines corresponding to (e.g., primarily corresponding to) the first magnetic field (412/512/612) and the second magnetic field (522/622/722), as well as the magnitude of the total magnetic field (424/524/624/724) plotted as a function of the axial position within and around the magnetic lens 400/500/600/700.

FIG. 4 illustrates an example in which the first electrical current supplied to the first coil is 457 Ampere-turns (At) and in which second electrical current supplied to the second coil is zero.

Figure 5:
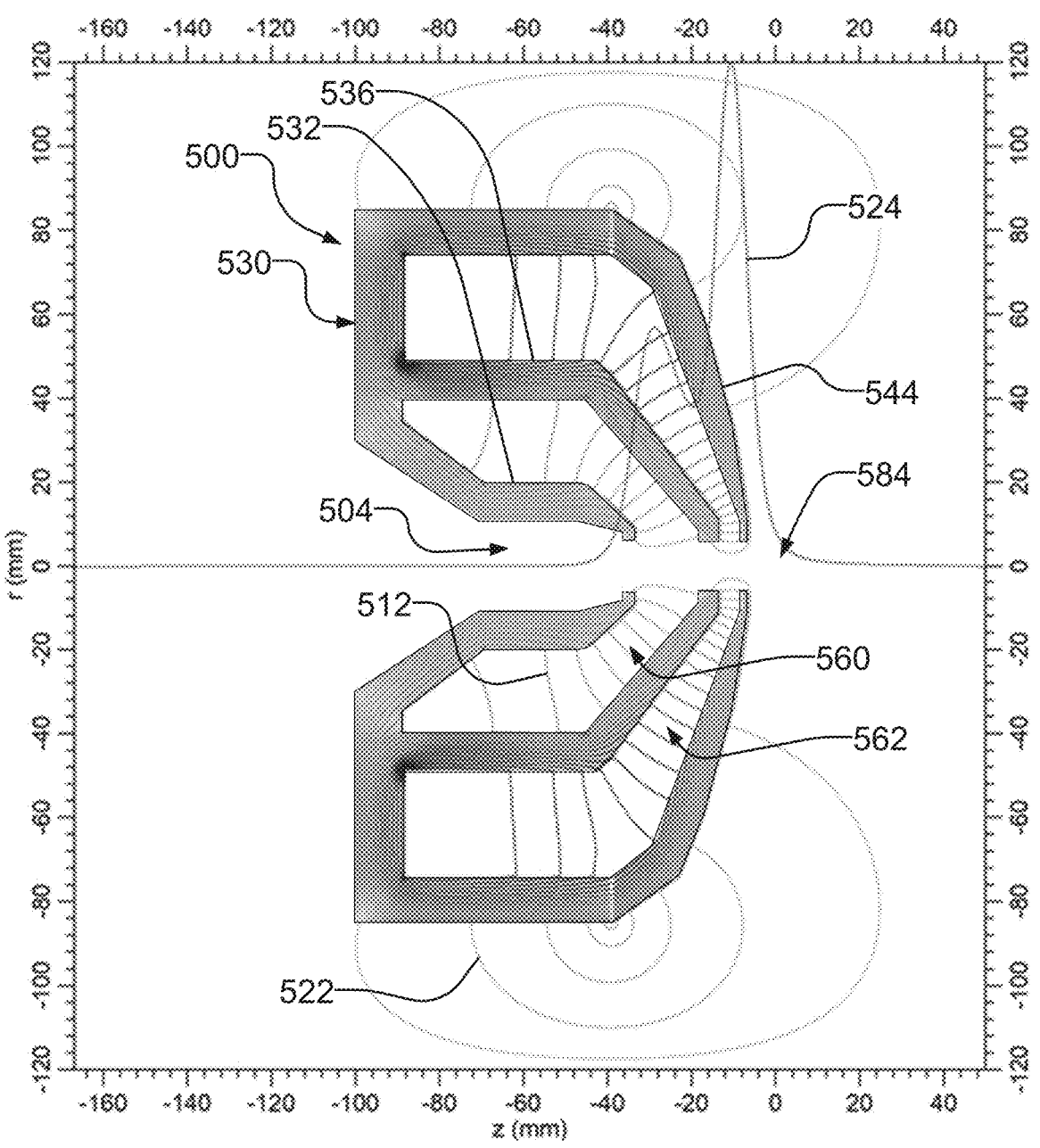
FIG. 5 is a schematic representation of a first magnetic field, a second magnetic field, and a magnitude of total magnetic field generated by a magnetic lens according to a second example.

FIG. 5 illustrates an example in which the first electrical current supplied to the first coil is 400 At and in which second electrical current supplied to the second coil is 680 At.

Figure 6:
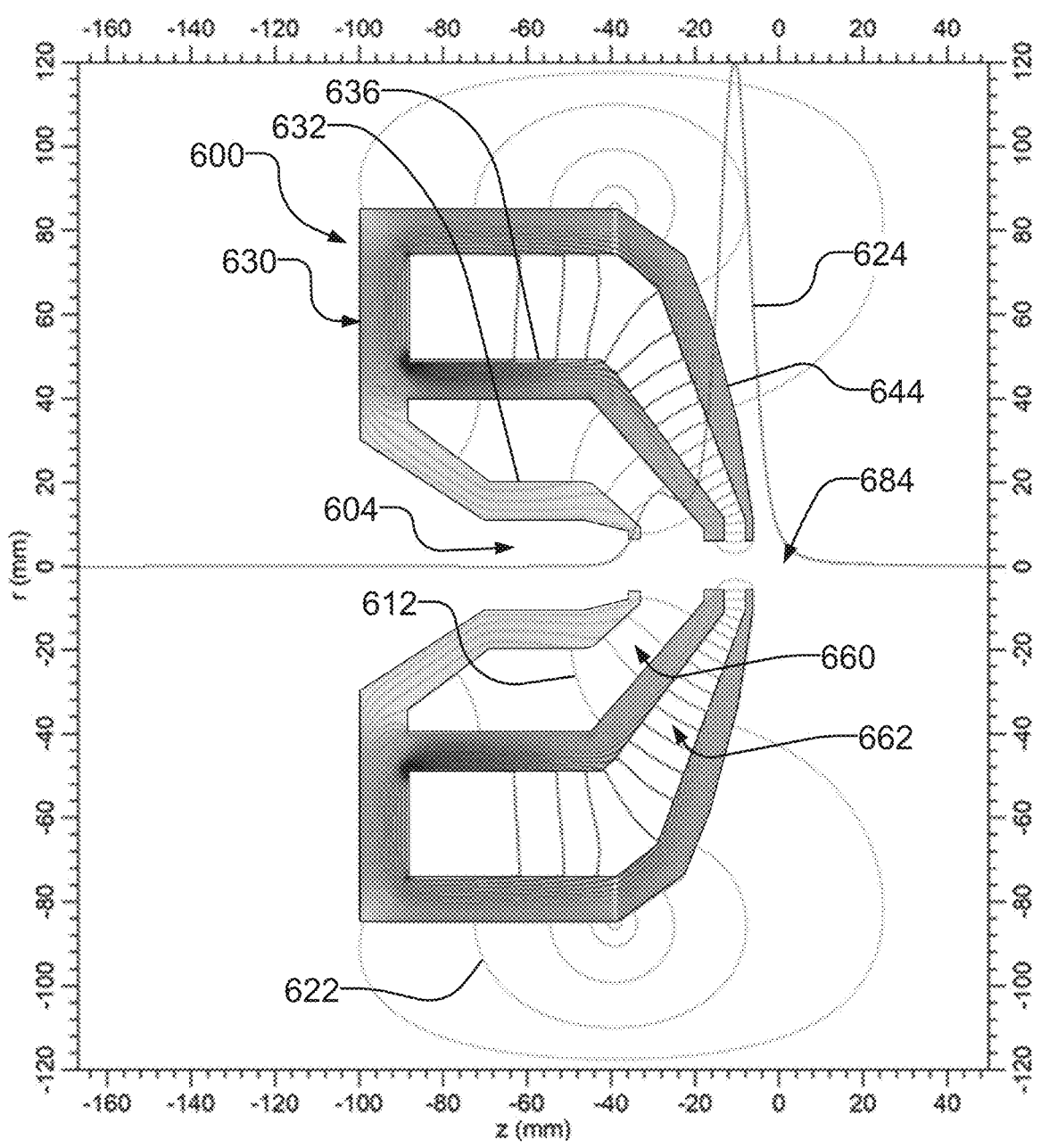
FIG. 6 is a schematic representation of a first magnetic field, a second magnetic field, and a magnitude of total magnetic field generated by a magnetic lens according to a third example.

FIG. 6 illustrates an example in which the first electrical current supplied to the first coil is 200 At and in which second electrical current supplied to the second coil is 1167 At.

Figure 7:
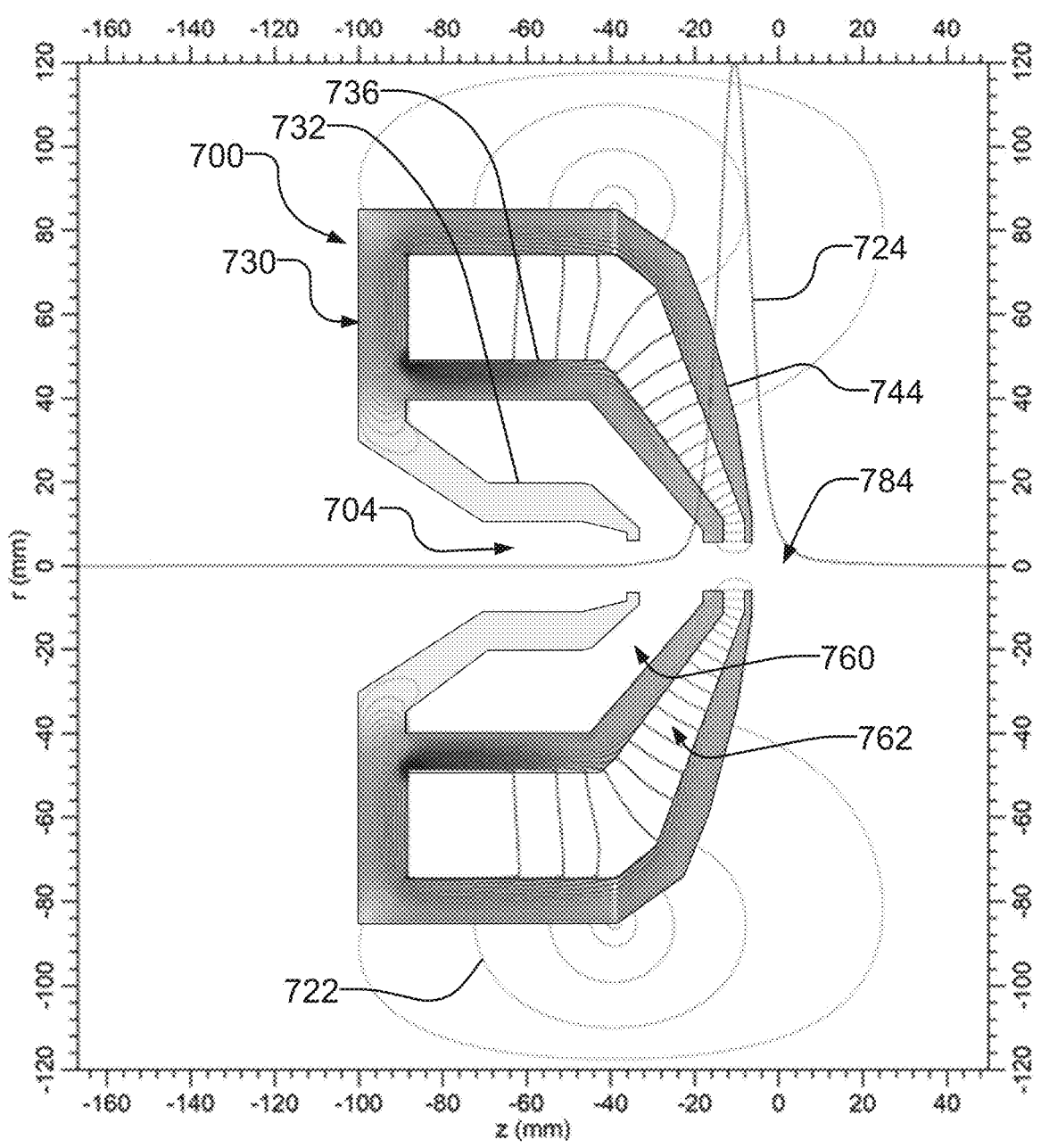
FIG. 7 is a schematic representation of a first magnetic field, a second magnetic field, and a magnitude of total magnetic field generated by a magnetic lens according to a fourth example.

FIG. 7 illustrates an example in which the first electrical current supplied to the first coil is zero and in which second electrical current supplied to the second coil is 1277 At.

In each of FIGS. 4-7, it may be seen that the magnitude of the total magnetic field 424/524/624/724 rapidly attenuates exterior of the lens body 430/530/630/730, and in particular at axial locations corresponding to the central bore 404/504/604/704. Specifically, FIGS. 4-7 illustrates that the magnitude of the total magnetic field 424/524/624/724 at the sample location 484/584/684/784 is a small proportion of the maximum magnitude of the total magnetic field 424/524/624/724 within and/or immediately adjacent to the central bore 404/504/604/704. In this manner, the magnetic lenses disclosed herein can operate to substantially shield and/or isolate a sample positioned at the sample location 484/584/684/784 from the total magnetic field, thereby enabling the use of a compound magnetic lens in conjunction with magnetically sensitive samples.

Figure 8:
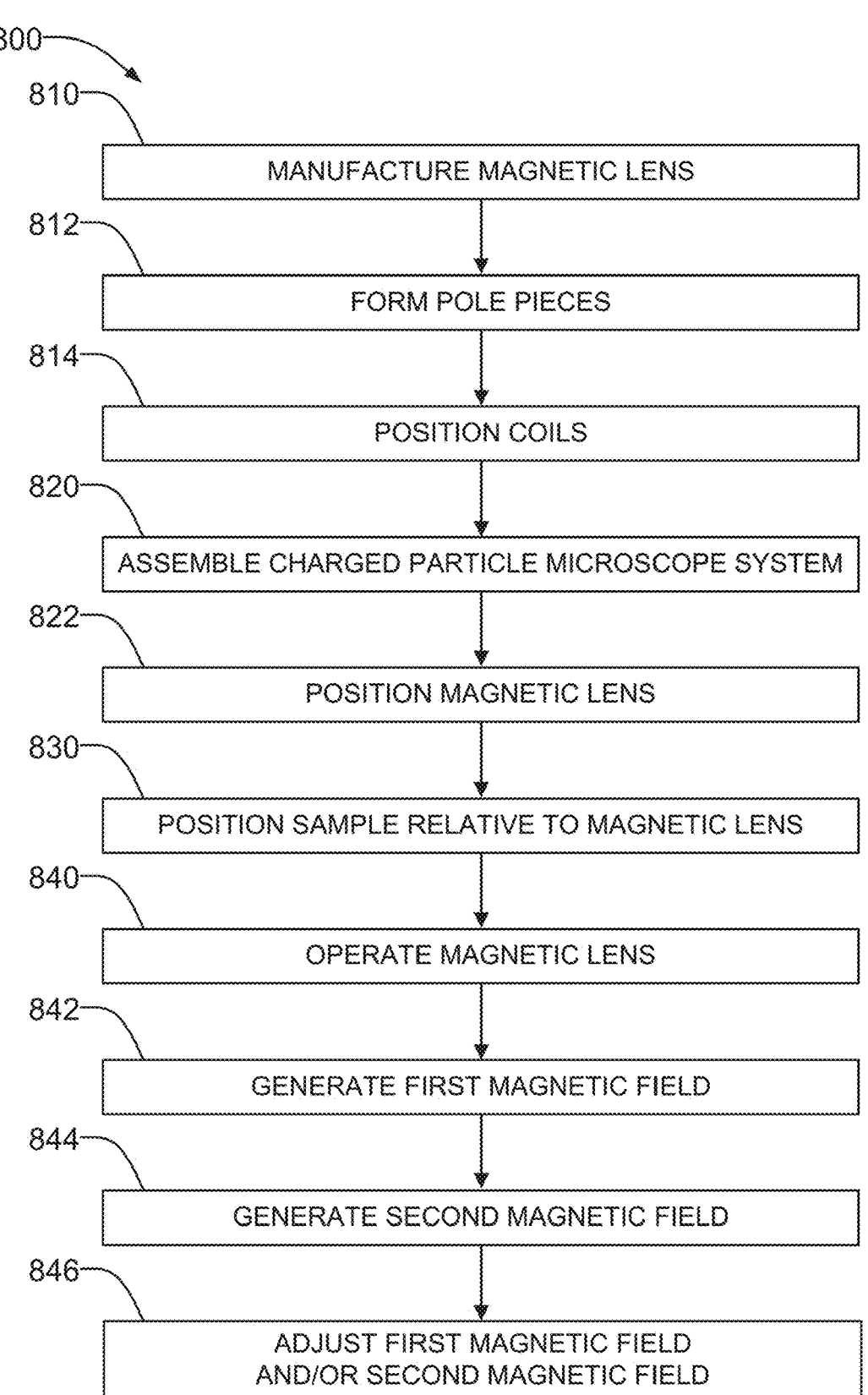
FIG. 8 is a flow chart depicting methods of manufacturing and/or using a magnetic lens, according to an example.

FIG. 8 is a flowchart depicting examples of methods 800 of manufacturing and/or using a magnetic lens, such as the magnetic objective lens 138 and/or the magnetic lens 300. As shown in FIG. 8, a method 800 can include positioning, at 822, a sample (e.g., the sample 152 and/or the sample 382) relative to a magnetic lens and operating, at 840, the magnetic lens to focus a charged particle beam (e.g., the charged particle beam 122) to a focus location (e.g., the focus location 124 and/or the sample location 384).

In some examples, the positioning the sample at 822 includes positioning such that at least a portion of the sample is positioned at the focus location.

In some examples, the positioning the sample at 822 includes positioning such that the sample and the magnetic lens are separated by a working distance, and the operating the magnetic lens at 840 includes adjusting a magnification of the magnetic lens while the working distance is held constant.

In some examples, the positioning the sample at 822 includes positioning the sample fully exteriorly of the magnetic lens.

In some examples, the operating the magnetic lens at 840 includes generating a magnetic field to focus the charged particle beam without immersing the sample in the magnetic field. For example, the positioning the sample at 822 can include positioning such that the sample is at least substantially isolated from the magnetic field. In this manner, a sample that is at least substantially isolated from (e.g., spaced apart from and/or localized away from) a magnetic field may be described as not being immersed in the magnetic field.

In some examples, and as shown in FIG. 8, the operating the magnetic lens at 840 includes generating, at 842 and with a first coil of the magnetic lens, a first magnetic field and generating, at 844 and with a second coil of the magnetic lens, second magnetic field. In some such examples, the generating the first magnetic field at 842 and the generating the second magnetic field at 844 are performed such that the first magnetic field and the second magnetic field form a common magnetic circuit. Additionally or alternatively, the generating the first magnetic field at 842 and the generating the second magnetic field at 844 can be performed such that the common magnetic circuit extends through each of a plurality of pole pieces of the magnetic lens.

In some examples, and as shown in FIG. 3, the operating the magnetic lens includes adjusting, at 846, one or both of the first magnetic field and the second magnetic field to vary a magnification of the magnetic lens. In some such examples, the adjusting the one or both of the first magnetic field and the second magnetic field at 846 includes adjusting a ratio of a first field magnitude of the first magnetic field to a second field magnitude of the second magnetic field.

In some examples, the charged particle beam includes a plurality of charged particle beamlets. In such examples, the operating the magnetic lens at 840 can include focusing the plurality of charged particle beamlets to respective focus locations in a focal plane. In such examples, the operating the magnetic lens at 840 also can include the adjusting the one or both of the first magnetic field and the second magnetic field at 846 to vary a pitch of the focused charged particle beamlets at the focal plane without shifting a location of the focal plane.

In some examples, and as shown in FIG. 8, the method 800 further includes, prior to the operating the magnetic lens, assembling, at 820, a charged particle microscope system (e.g., the charged particle microscope system 100) that includes the magnetic lens. In some such examples, the charged particle microscope system includes a charged particle source (e.g., the charged particle source 120) configured to emit the charged particle beam along an optical axis (e.g., the optical axis 112), and the assembling the charged particle microscope system at 820 includes positioning the magnetic lens such that the optical axis extends through a central bore of the magnetic lens.

In some examples, and as shown in FIG. 8, the method 800 includes manufacturing, at 810, a magnetic lens comprising a plurality of pole pieces defining at least two axial gaps and at least two independent coils in respective communication with the at least two axial gaps. For example, the plurality of pole pieces can include and/or be the first pole piece 332, the second pole piece 336, and the third pole piece 344, and the at least two axial gaps can include and/or be the first pole piece gap 350 and the second pole piece gap 354.

In some examples, the manufacturing the magnetic lens at 810 includes integrally forming two or more of the first pole piece, the second pole piece, and the third pole piece as a single unit.

Additionally or alternatively, in some examples, the manufacturing the magnetic lens at 810 can include separately forming two or more of the first pole piece, the second piece, and the third pole piece and operatively coupling the two or more of the first pole piece, the second pole piece, and the third pole piece to one another.

In some examples, wherein the manufacturing the magnetic lens includes positioning the at least two independent coils such that each coil of the at least two independent coils is positioned between a corresponding pair of pole pieces of the plurality of pole pieces.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

Unless otherwise stated, as used herein, the term "substantially" means the listed value and/or property and any value and/or property that is at least 75% of the listed value and/or property. Equivalently, the term "substantially" means the listed value and/or property and any value and/or property that differs from the listed value and/or property by at most 25%. For example, "substantially equal" refers to quantities that are fully equal, as well as to quantities that differ from one another by up to 25%.

The systems, apparatus, and methods described herein should not be construed as limiting in any way. Instead, the present disclosure is directed toward all novel and non-obvious features and aspects of the various disclosed examples, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various examples. Computer-executable instructions for program modules may be executed within a local or distributed computing system. In general, a computing system or computing device can be local or distributed, and can include any combination of special-purpose hardware and/or general-purpose hardware with software implementing the functionality described herein.

In various examples described herein, a module (e.g., component or engine) can be "programmed" and/or "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

Described algorithms may be, for example, embodied as software or firmware instructions carried out by a digital computer. For instance, any of the disclosed methods can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed examples can be stored on the one or more volatile, non-transitory computer-readable media as computer-executable instructions, which when executed by the one or more processors, cause the one or more processors to perform any of the disclosed techniques or subsets of techniques.

Having described and illustrated the principles of the disclosed technology with reference to the illustrated examples, it will be recognized that the illustrated examples can be modified in arrangement and detail without departing from such principles. For instance, elements of examples performed in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

Additional Examples of the Disclosed Technology

In view of the above-described implementations of the disclosed subject matter, this application discloses the additional examples enumerated below. It should be noted that one feature of an example in isolation or more than one feature of the example taken in combination with and. optionally, in combination with one or more feature of one or more further examples are further examples also falling within the disclosure of this application.

Example 1. An apparatus, comprising a magnetic lens configured to direct a charged particle beam to a sample location in a focal plane, wherein the magnetic lens comprises: a plurality of pole pieces defining at least two axial gaps; and at least two independent coils in respective communication with the at least two axial gaps and configured to generate magnetic fields such that the magnetic lens operates as a single objective lens with variable main objective plane, wherein the variable main objective plane permits selective adjustment of a magnification of the charged particle beam at the focal plane without immersing the sample location in the magnetic fields produced by coils of the magnetic lens.

Example 2. The apparatus of any example herein, particularly example 1, wherein the magnetic lens comprises a central bore, and wherein the plurality of pole pieces comprises: a first pole piece extending circumferentially around the central bore; a second pole piece extending circumferentially around the central bore and at least partially disposed radially exteriorly of the first pole piece; and a third pole piece extending circumferentially around the central bore and at least partially disposed radially exteriorly of the second pole piece.

Example 3. The apparatus of any example herein, particularly any one of examples 1-2, wherein the at least two independent coils are configured to generate a total magnetic field, wherein the total magnetic field has a maximum focusing field amplitude that represents a maximum amplitude of the total magnetic field within the magnetic lens, and wherein a magnitude of the total magnetic field as measured at the sample location is at most 5% of the maximum focusing field amplitude.

Example 4. A magnetic lens comprising: a lens body with a central bore; a first coil supported by the lens body and configured to generate a first magnetic field with a first field magnitude; and a second coil supported by the lens body and configured to generate a second magnetic field with a second field magnitude; wherein the first magnetic field and the second magnetic field are at least partially spatially overlapping within the central bore, wherein the magnetic lens is configured to direct a charged particle beam to a sample location exterior to the lens body, and wherein the lens body comprises a plurality of pole pieces that confine the first magnetic field and the second magnetic field to a region away from the sample location.

Example 5. The magnetic lens of any example herein, particularly example 4, wherein the plurality of pole pieces comprises: a first pole piece extending circumferentially around the central bore; a second pole piece extending circumferentially around the central bore and at least partially disposed radially exteriorly of the first pole piece; and a third pole piece extending circumferentially around the central bore and at least partially disposed radially exteriorly of the second pole piece.

Example 6. The magnetic lens of any example herein, particularly any one of examples 4-5, wherein the magnetic lens is configured such that the first magnetic field and the second magnetic field overlap to form a total magnetic field that is a sum of the first magnetic field and the second magnetic field, wherein the total magnetic field has a maximum focusing field amplitude that represents a maximum amplitude of the total magnetic field within the central bore, and wherein a magnitude of the total magnetic field as measured at the sample location is one or more of at most 5% of the maximum focusing field amplitude, at most 2% of the maximum focusing field amplitude, at most 1% of the maximum focusing field amplitude, at most 0.5% of the maximum focusing field amplitude, and at most 0.1% of the maximum focusing field amplitude.

Example 7. A magnetic lens comprising: a lens body with a central bore; a first coil supported by the lens body and configured to generate a first magnetic field with a first field magnitude; and a second coil supported by the lens body and configured to generate a second magnetic field with a second field magnitude; wherein the magnetic lens is configured such that adjusting a ratio between the first field magnitude and the second field magnitude operates to adjust a location of a focus location of a charged particle beam passing through the central bore, wherein the focus location is positioned exteriorly of the lens body, and wherein each of the first magnetic field and the second magnetic field is localized to a region away from the focus location.

Example 8. The magnetic lens of any example herein, particularly example 7, wherein the magnetic lens is configured such that the first magnetic field and the second magnetic field overlap to form a total magnetic field that is a sum of the first magnetic field and the second magnetic field, wherein the total magnetic field has a maximum focusing field amplitude that represents a maximum amplitude of the total magnetic field within the central bore, and wherein a magnitude of the total magnetic field as measured at the focus location is one or more of at most 5% of the maximum focusing field amplitude, at most 2% of the maximum focusing field amplitude, at most 1% of the maximum focusing field amplitude, at most 0.5% of the maximum focusing field amplitude, and at most 0.1% of the maximum focusing field amplitude.

Example 9. A magnetic lens comprising: a lens body; a first coil supported by the lens body and configured to generate a first magnetic field; and a second coil supported by the lens body and configured to generate a second magnetic field; wherein the lens body comprises: a central bore configured to receive a charged particle beam passing through the magnetic lens; a first pole piece extending circumferentially around the central bore; a second pole piece extending circumferentially around the central bore and at least partially disposed radially exteriorly of the first pole piece; and a third pole piece extending circumferentially around the central bore and at least partially disposed radially exteriorly of the second pole piece.

Example 10. The magnetic lens of any example herein, particularly example 9, wherein the first coil is at least partially disposed between the first pole piece and the second pole piece, and wherein the second coil is at least partially disposed between the second pole piece and the third pole piece.

Example 11. The magnetic lens of any example herein, particularly any one of examples 9-10, wherein the first pole piece and the second pole piece are configured to guide the first magnetic field toward the central bore, and wherein the second pole piece and the third pole piece are configured to guide the second magnetic field toward the central bore.

Example 12. The magnetic lens of any example herein, particularly any one of examples 9-11, wherein the magnetic lens is configured such that the first pole piece, the second pole piece, and the third pole piece collectively form a portion of a common magnetic circuit when the first coil generates the first magnetic field and the second coil generates the second magnetic field.

Example 13. The magnetic lens of any example herein, particularly example 12, wherein the common magnetic circuit extends into the central bore.

Example 14. The magnetic lens of any example herein, particularly any one of examples 9-13, wherein the magnetic lens is configured such that selectively varying one or both of the first magnetic field and the second magnetic field adjusts one or more of: (i) a location of a main objective plane of the magnetic lens; (ii) a magnification of the magnetic lens; and (iii) a convergence angle of the charged particle beam exiting the magnetic lens.

Example 15. The magnetic lens of any example herein, particularly any one of examples 9-15, wherein the magnetic lens is configured to focus the charged particle beam onto a sample at one or both of a focus location and a focal plane.

Example 16. The magnetic lens of any example herein, particularly example 15, wherein the magnetic lens is configured such that selectively varying one or both of the first magnetic field and the second magnetic field adjusts a location of a main objective plane of the magnetic lens such that the focal plane of the charged particle beam remains unchanged.

Example 17. The magnetic lens of any example herein, particularly any one of examples 15-16, wherein the magnetic lens is configured such that the sample is positionable fully exteriorly of the magnetic lens during operative use of the magnetic lens.

Example 18. The magnetic lens of any example herein, particularly any one of examples 15-17, wherein the magnetic lens is configured such that, during operative use of the magnetic lens, the lens body and the sample are separated by a working distance, as measured along a direction parallel to a central axis of the magnetic lens, that is one or more of at least 1 millimeter (mm), at least 5 mm, at least 10 mm, at least 15 mm, at least 20 mm, at most 25 mm, at most 17 mm, at most 12 mm, at most 7 mm, and at most 2 mm.

Example 19. The magnetic lens of any example herein, particularly any one of examples 15-18, wherein the magnetic lens is configured such that, during operative use of the magnetic lens, the lens body and the sample are separated by a working distance, as measured along a direction parallel to a central axis of the magnetic lens, and wherein the magnetic lens is configured such that a magnification of the magnetic lens is adjustable while the working distance remains constant.

Example 20. The magnetic lens of any example herein, particularly any one of examples 15-18, wherein the magnetic lens is configured such that the sample is at least substantially isolated from the first magnetic field and from the second magnetic field during operative use of the magnetic lens.

Example 21. The magnetic lens of any example herein, particularly any one of examples 15-20, wherein the magnetic lens is configured such that the first magnetic field and the second magnetic field overlap to form a total magnetic field that is a sum of the first magnetic field and the second magnetic field.

Example 22. The magnetic lens of any example herein, particularly example 21, wherein the total magnetic field has a maximum focusing field amplitude that represents a maximum amplitude of the total magnetic field within the central bore, and wherein a magnitude of the total magnetic field as measured at the sample is one or more of at most 40% of the maximum focusing field amplitude, at most 30% of the maximum focusing field amplitude, at most 20% of the maximum focusing field amplitude, at most 10% of the maximum focusing field amplitude, at most 5% of the maximum focusing field amplitude, at most 2% of the maximum focusing field amplitude, at most 1% of the maximum focusing field amplitude, at most 0.5% of the maximum focusing field amplitude, at most 0.1% of the maximum focusing field amplitude, and at most 0.01% of the maximum focusing field amplitude.

Example 23. The magnetic lens of any example herein, particularly any one of examples 9-22, wherein the first magnetic field is generated with a first field magnitude, wherein the second magnetic field is generated with a second field magnitude, and wherein the magnetic lens is configured such that adjusting a ratio between the first field magnitude and the second field magnitude operates to adjust one or more of: a main objective plane of the magnetic lens; (ii) a magnification of the magnetic lens; and (iii) a convergence angle of the charged particle beam exiting the magnetic lens.

Example 24. The magnetic lens of any example herein, particularly any one of examples 9-23, wherein the charged particle beam comprises a plurality of charged particle beamlets, wherein the magnetic lens is configured to focus the plurality of charged particle beamlets to respective focus locations in a focal plane, and.

Example 25. The magnetic lens of any example herein, particularly example 24, wherein the magnetic lens is configured to vary a pitch of the focused charged particle beamlets at the focal plane.

Example 26. The magnetic lens of any example herein, particularly any one of examples 9-25, wherein the charged particle beam travels along an optical axis that is parallel to a central axis of the magnetic lens that extends through the central bore.

Example 27. The magnetic lens of any example herein, particularly any one of examples 9-26, wherein the magnetic lens defines a central axis, and wherein the lens body is at least substantially axially symmetric about the central axis.

Example 28. The magnetic lens of any example herein, particularly any one of examples 9-27, wherein the magnetic lens defines a central axis, and wherein each of the first pole piece, the second pole piece, and the third pole piece extends fully circumferentially around the central axis.

Example 29. The magnetic lens of any example herein, particularly any one of examples 9-28, wherein one or more of the first pole piece, the second pole piece, and the third pole piece at least partially defines the central bore.

Example 30. The magnetic lens of any example herein, particularly example 29, wherein the central bore has a bore diameter, as measured along a direction perpendicular to a central axis of the magnetic lens, that is one or more of at least 0.1 mm, at least 0.5 mm, at least 1 mm, at least 5 mm, at most 10 mm, at most 2 mm, at most 0.7 mm, and at most 0.2 mm.

Example 31. The magnetic lens of any example herein, particularly any one of examples 9-30, wherein the second pole piece is positioned between the first pole piece and the third pole piece.

Example 32. The magnetic lens of any example herein, particularly any one of examples 9-31, wherein the first pole piece terminates at a first terminal edge region, wherein the second pole piece terminates at a second terminal edge region, and wherein the third pole piece terminates at a third terminal edge region.

Example 33. The magnetic lens of any example herein, particularly example 32, wherein each of the first terminal edge region, the second terminal edge region, and the third terminal edge region comprises a substantially annular surface.

Example 34. The magnetic lens of any example herein, particularly any one of examples 32-33, wherein each of the first terminal edge region, the second terminal edge region, and the third terminal edge region is characterized by a respective diameter thereof, as measured along a direction perpendicular to a central axis of the magnetic lens, and wherein the respective diameters of the first terminal edge region, the second terminal edge region, and the third terminal edge region differ from one another by at most 20%.

Example 35. The magnetic lens of any example herein, particularly any one of examples 32-34, wherein the first terminal edge region and the second terminal edge region are separated by a first pole piece gap with a first gap width, and wherein the second terminal edge region and the third terminal edge region are separated by a second pole piece gap with a second gap width.

Example 36. The magnetic lens of any example herein, particularly example 35, wherein a ratio of the first gap width to the second gap width is one or more of at least 1:10, at least 1:5, at least 1:2, at least 1:1, at least 2:1, at least 5:1, at most 10:1, at most 5:1, at most 2:1, at most 1:1, at most 1:2, at most 1:5, and at most 1:10.

Example 37. The magnetic lens of any example herein, particularly any one of examples 35-36, wherein one or both of the first pole piece gap and the second pole piece gap face a central axis of the magnetic lens.

Example 38. The magnetic lens of any example herein, particularly any one of examples 9-37, wherein two or more of the first pole piece, the second pole piece, and the third pole piece are integrally formed with one another.

Example 39. The magnetic lens of any example herein, particularly any one of examples 9-38, wherein two or more of the first pole piece, the second pole piece, and the third pole piece are formed separately and operatively connected to one another.

Example 40. The magnetic lens of any example herein, particularly any one of examples 9-39, wherein the lens body further comprises a pole piece connection base, and wherein two or more of the first pole piece, the second pole piece, and the third pole piece are coupled to one another via the pole piece connection base.

Example 41. The magnetic lens of any example herein, particularly any one of examples 9-40, wherein the third pole piece is proximate the sample relative to each of the first pole piece and the second pole piece during operative use of the magnetic lens.

Example 42. The magnetic lens of any example herein, particularly any one of examples 9-41, wherein the third pole piece is characterized by a taper angle, as measured between a surface of the third pole piece proximate to the central bore and a direction perpendicular to a central axis of the magnetic lens, that is one or more of 0 degrees, at least 1 degree, at least 5 degrees, at least 10 degrees, at least 20 degrees, at least 30 degrees, at most 45 degrees, at most 25 degrees, at most 15 degrees, at most 7 degrees, and at most 3 degrees.

Example 43. The magnetic lens of any example herein, particularly any one of examples 9-42, wherein the second pole piece comprises a plurality of spaced apart pole piece segments.

Example 44. The magnetic lens of any example herein, particularly example 43, wherein the plurality of spaced apart pole piece segments comprises a first intermediate pole piece segment and a second intermediate pole piece segment at least partially spaced apart from the first intermediate pole piece segment Example 45. The magnetic lens of any example herein, particularly example 44, wherein the first pole piece and the first intermediate pole piece segment are configured to guide the first magnetic field toward the central bore, and wherein the second intermediate pole piece segment and the third pole piece are configured to guide the second magnetic field toward the central bore.

Example 46. The magnetic lens of any example herein, particularly any one of examples 44-45, wherein, during operative use of the magnetic lens, each of the first intermediate pole piece segment and the second intermediate pole piece segment forms a portion of a common magnetic circuit that additionally includes each of the first pole piece and the third pole piece.

Example 47. The magnetic lens of any example herein, particularly any one of examples 9-46, wherein the second pole piece is a monolithic pole piece.

Example 48. The magnetic lens of any example herein, particularly any one of examples 9-47, wherein the first pole piece and the second pole piece define a first field region therebetween, wherein the second pole piece and the third pole piece define a second field region therebetween that is separate from the first field region, and wherein the second pole piece extends continuously between the first field region and the second field region.

Example 49. The magnetic lens of any example herein, particularly any one of examples 9-48, wherein the first pole piece and the second pole piece define a first field region therebetween, wherein the second pole piece and the third pole piece define a second field region therebetween that is separate from the first field region, and wherein the first field region is open to the central bore.

Example 50. The magnetic lens of any example herein, particularly example 49, wherein the second field region is open to the central bore.

Example 51. The magnetic lens of any example herein, particularly any one of examples 49-50, wherein the magnetic lens is configured such that the first pole piece, the second pole piece, and the third pole piece collectively form a portion of a common magnetic circuit that extends through each of the first field region and the second field region.

Example 52. The magnetic lens of any example herein, particularly any one of examples 49-51, wherein the first field region extends between the first coil and the central bore, and wherein the second field region extends between the second coil and the central bore.

Example 53. The magnetic lens of any example herein, particularly any one of examples 49-52, wherein the first pole piece and the second pole piece are configured to guide the first magnetic field through the first field region to the central bore, and wherein the second pole piece and the third pole piece are configured to guide the second magnetic field through the second field region to the central bore.

Example 54. A charged particle microscope system comprising: a charged particle source configured to emit a charged particle beam along an optical axis and toward a sample; a sample holder configured to support the sample; and a magnetic objective lens configured to focus the charged particle beam to a focus location corresponding to a location of the sample, wherein the magnetic objective lens comprises the magnetic lens of any example herein, particularly any one of examples 1-52.

Example 55. The charged particle microscope system of any example herein, particularly example 54, wherein the charged particle beam comprises an electron beam, and wherein the charged particle microscope system is configured to operate as a scanning electron microscope (SEM).

Example 56. The charged particle microscope system of any example herein, particularly example 55, further comprising an electron detector configured to detect electrons emitted from the sample.

Example 57. The charged particle microscope system of any example herein, particularly example 56, wherein the electron detector is configured to detect secondary electrons generated via an interaction between the charged particle beam and the sample.

Example 58. The charged particle microscope system of any example herein, particularly any one of examples 54-57, further comprising one or more scan coils configured to deflect the charged particle beam to scan the charged particle beam across the sample.

Example 59. The charged particle microscope system of any example herein, particularly any one of examples 54-58, further comprising a condenser lens configured to converge the charged particle beam toward the sample.

Example 60. The charged particle microscope system of any example herein. particularly any one of examples 54-59, further comprising a controller configured to at least partially control operation of the charged particle microscope system.

Example 61. The charged particle microscope system of any example herein, particularly example 60, wherein the controller is configured to at least partially control operation of the magnetic objective lens.

Example 62. The charged particle microscope system of any example herein. particularly any one of examples 60-61, wherein the magnetic objective lens comprises a first coil configured to generate a first magnetic field and a second coil configured to generate a second magnetic field, and wherein the controller is configured to selectively and dynamically vary one or both of the first magnetic field and the second magnetic field.

Example 63. The charged particle microscope system of any example herein, particularly any one of examples 60-62, wherein the controller comprises a first current source configured to convey a first electrical current to the first coil and a second current source configured to convey a second electrical current to the second coil, and wherein the controller is configured to selectively vary one or both of the first electrical current and the second electrical current to adjust a focal plane of the magnetic objective lens.

Example 64. The charged particle microscope system of any example herein, particularly any one of examples 60-63, wherein the controller comprises one or more input devices for receiving inputs from a human user to at least partially direct operation of the charged particle microscope system.

Example 65. The charged particle microscope system of any example herein, particularly any one of examples 60-64, wherein the controller comprises one or more output devices for conveying information to a human user.

Example 66. The charged particle microscope system of any example herein, particularly any one of examples 54-65, wherein the sample holder is positioned fully exteriorly of the magnetic objective lens.

Example 67. The charged particle microscope system of any example herein, particularly any one of examples 54-66, wherein the charged particle microscope system is configured such that the sample is positioned fully exteriorly of the magnetic objective lens during operative use of the charged particle microscope system.

Example 68. A method, comprising: positioning a sample relative to a magnetic lens; and operating the magnetic lens to focus a charged particle beam to a focus location, wherein the magnetic lens is the magnetic lens of any example herein, particularly any one of examples 1-53.

Example 69. The method of any example herein, particularly example 68, wherein the positioning the sample comprises positioning such that at least a portion of the sample is positioned at the focus location.

Example 70. The method of any example herein, particularly any one of examples 68-69, wherein the positioning the sample comprises positioning such that the sample and the magnetic lens are separated by a working distance, and wherein the operating the magnetic lens comprises adjusting a magnification of the magnetic lens while the working distance is held constant.

Example 71. The method of any example herein, particularly example 70, wherein the positioning the sample comprises positioning such that the working distance is one or more of at least 1 millimeter (mm), at least 5 mm, at least 10 mm, at least 15 mm, at least 20 mm, at most 25 mm, at most 17 mm, at most 12 mm, at most 7 mm, and at most 2 mm.

Example 72. The method of any example herein, particularly any one of examples 68-71, wherein the positioning the sample comprises positioning the sample fully exteriorly of the magnetic lens.

Example 73. The method of any example herein, particularly any one of examples 68-72, wherein the operating the magnetic lens comprises generating a magnetic field to focus the charged particle beam without immersing the sample in the magnetic field.

Example 74. The method of any example herein, particularly any one of examples 68-73, wherein the operating the magnetic lens comprises generating a magnetic field to focus the charged particle beam, and wherein the positioning the sample comprises positioning such that the sample is at least substantially isolated from the magnetic field.

Example 75. The method of any example herein, particularly any one of examples 68-74, wherein the operating the magnetic lens comprises: generating, with a first coil of the magnetic lens, a first magnetic field; and generating, with a second coil of the magnetic lens, second magnetic field, and wherein the generating the first magnetic field and the generating the second magnetic field are performed such that the first magnetic field and the second magnetic field form a common magnetic circuit.

Example 76. The method of any example herein, particularly example 75, wherein the generating the first magnetic field and the generating the second magnetic field are performed such that the common magnetic circuit extends through each of the plurality of pole pieces.

Example 77. The method of any example herein, particularly any one of examples 75-76, wherein the operating the magnetic lens comprises adjusting one or both of the first magnetic field and the second magnetic field to shift a location of a main objective plane of the magnetic lens.

Example 78. The method of any example herein, particularly example 77, wherein the adjusting one or both of the first magnetic field and the second magnetic field comprises adjusting a ratio of a first field magnitude of the first magnetic field to a second field magnitude of the second magnetic field.

Example 79. The method of any example herein, particularly any one of examples 75-78, wherein the charged particle beam comprises a plurality of charged particle beamlets, wherein the operating the magnetic lens comprises: focusing the plurality of charged particle beamlets to respective focus locations in a focal plane; and adjusting one or both of the first magnetic field and the second magnetic field to vary a pitch of the focused charged particle beamlets at the focal plane without shifting a location of the focal plane.

Example 80. The method of any example herein, particularly any one of examples 68-79, further comprising, prior to the operating the magnetic lens, assembling a charged particle microscope system that comprises the magnetic lens.

Example 81. The method of any example herein, particularly example 80, wherein the charged particle microscope system comprises a charged particle source configured to emit the charged particle beam along an optical axis, and wherein the assembling the charged particle microscope system comprises positioning the magnetic lens such that the optical axis extends through a central bore of the magnetic lens.

Example 82. A method, comprising: manufacturing a magnetic lens comprising a plurality of pole pieces defining at least two axial gaps and at least two independent coils in respective communication with the at least two axial gaps.

Example 83. The method of any example herein, particularly example 82, wherein the plurality of pole pieces comprises a first pole piece, a second pole piece, and a third pole piece, and wherein the manufacturing the magnetic lens comprises integrally forming two or more of the first pole piece, the second pole piece, and the third pole piece as a single unit.

Example 84. The method of any example herein, particularly any one of examples 82-83, wherein the plurality of pole pieces comprises a first pole piece, a second pole piece, and a third pole piece, and wherein the manufacturing the magnetic lens comprises: separately forming two or more of the first pole piece, the second piece, and the third pole piece; and operatively coupling the two or more of the first pole piece, the second pole piece, and the third pole piece to one another.

Example 85. The method of any example herein, particularly any one of examples 82-84, wherein the manufacturing the magnetic lens comprises positioning the at least two independent coils such that each coil of the at least two independent coils is positioned between a corresponding pair of pole pieces of the plurality of pole pieces.

The features described herein with regard to any example can be combined with other features described in any one or more of the other examples, unless otherwise stated. For example, any one or more of the features of one magnetic lens can be combined with any one or more features of another magnetic lens.

In view of the many possible ways in which the principles of the disclosure may be applied, it should be recognized that the illustrated configurations depict examples of the disclosed technology and should not be taken as limiting the scope of the disclosure nor the claims. Rather, the scope of the claimed subject matter is defined by the following claims and their equivalents.

We claim:

1. An apparatus, comprising:
   a magnetic lens configured to direct a charged particle beam to a sample location in a focal plane, wherein the magnetic lens comprises:
   a plurality of pole pieces defining at least two axial gaps; and
   at least two independent coils in respective communication with the at least two axial gaps and configured to generate overlapping magnetic fields to form a total magnetic field that is a sum of the overlapping magnetic fields, such that the magnetic lens operates as a single objective lens with variable main objective plane,
   wherein the variable main objective plane permits selective adjustment of a magnification of the charged particle beam at the focal plane without immersing the sample location in the magnetic fields produced by coils of the magnetic lens.

2. The apparatus of claim 1, wherein the magnetic lens comprises a central bore, and wherein the plurality of pole pieces comprises:
   a first pole piece extending circumferentially around the central bore;
   a second pole piece extending circumferentially around the central bore and at least partially disposed radially exteriorly of the first pole piece; and
   a third pole piece extending circumferentially around the central bore and at least partially disposed radially exteriorly of the second pole piece.

3. The apparatus of claim 1, wherein the at least two independent coils are configured to generate a total magnetic field, wherein the total magnetic field has a maximum focusing field amplitude that represents a maximum amplitude of the total magnetic field within the magnetic lens, and wherein a magnitude of the total magnetic field as measured at the sample location is at most 5% of the maximum focusing field amplitude.

4. A magnetic lens comprising:

a lens body;

a first coil supported by the lens body and configured to generate a first magnetic field; and a second coil supported by the lens body and configured to generate a second magnetic field, overlapping the first magnetic field to form a total magnetic field that is a sum of the first magnetic field and the second magnetic field;

wherein the lens body comprises:

a central bore configured to receive a charged particle beam passing through the magnetic lens;

a first pole piece extending circumferentially around the central bore;

a second pole piece extending circumferentially around the central bore and at least partially disposed radially exteriorly of the first pole piece; and a third pole piece extending circumferentially around the central bore and at least partially disposed radially exteriorly of the second pole piece, which together configure the magnetic lens to operate as a single objective lens with a variable main objective plane.

5. The magnetic lens of claim 4, wherein the magnetic lens is configured such that the first pole piece, the second pole piece, and the third pole piece collectively form a portion of a common magnetic circuit when the first coil generates the first magnetic field and the second coil generates the second magnetic field.

6. The magnetic lens of claim 4, wherein the magnetic lens is configured to focus the charged particle beam onto a sample at a focal plane, and wherein the magnetic lens is configured such that selectively varying one or both of the first magnetic field and the second magnetic field adjusts a location of a main objective plane of the magnetic lens such that the focal plane of the charged particle beam remains unchanged.

7. The magnetic lens of claim 6, wherein the magnetic lens is configured such that the first magnetic field and the second magnetic field overlap to form a total magnetic field that is a sum of the first magnetic field and the second magnetic field, wherein the total magnetic field has a maximum focusing field amplitude that represents a maximum amplitude of the total magnetic field within the central bore, and wherein a magnitude of the total magnetic field as measured at the sample is at most 2% of the maximum focusing field amplitude.

8. The magnetic lens of claim 4, wherein the first coil is at least partially disposed between the first pole piece and the second pole piece, and wherein the second coil is at least partially disposed between the second pole piece and the third pole piece.

9. The magnetic lens of claim 4, wherein the magnetic lens defines a central axis extending through the central bore, wherein each of the first pole piece, the second pole piece, and the third pole piece extends fully circumferentially around the central axis, and wherein one or more of the first pole piece, the second pole piece, and the third pole piece at least partially defines the central bore.

10. The magnetic lens of claim 4, wherein the first pole piece terminates at a first terminal edge region, wherein the second pole piece terminates at a second terminal edge region, wherein the third pole piece terminates at a third terminal edge region, wherein the first terminal edge region and the second terminal edge region are separated by a first pole piece gap, wherein the second terminal edge region and the third terminal edge region are separated by a second pole piece gap, and wherein each of the first pole piece gap and the second pole piece gap faces a central axis of the magnetic lens.

11. The magnetic lens of claim 4, wherein the first pole piece and the second pole piece define a first field region therebetween, wherein the second pole piece and the third pole piece define a second field region therebetween that is separate from the first field region, wherein each of the first field region and the second field region is open to the central bore, and wherein the magnetic lens is configured such that the first pole piece, the second pole piece, and the third pole piece collectively form a portion of a common magnetic circuit that extends through each of the first field region and the second field region.

12. The magnetic lens of claim 11, wherein the first field region extends between the first coil and the central bore, and wherein the second field region extends between the second coil and the central bore.

13. A charged particle microscope system comprising:

a charged particle source configured to emit a charged particle beam along an optical axis and toward a sample;

a sample holder configured to support the sample; and a magnetic objective lens configured to focus the charged particle beam to a focus location corresponding to a location of the sample;

wherein the magnetic objective lens comprises:

a lens body with a central bore through which the charged particle beam extends;

a first coil supported by the lens body and configured to generate a first magnetic field with a first field magnitude; and a second coil supported by the lens body and configured to generate a second magnetic field with a second field magnitude, overlapping the first magnetic field to form a total magnetic field magnitude that is a sum of the first field magnitude and the second field magnitude, which together configure the magnetic lens to operate as a single objective lens with a variable main objective plane, wherein the magnetic objective lens is configured such that adjusting a ratio between the first field magnitude and the second field magnitude operates to adjust a magnification of the magnetic objective lens, wherein the focus location is positioned exteriorly of the lens body, and wherein each of the first magnetic field and the second magnetic field is localized to a region away from the focus location.

14. The charged particle microscope system of claim 13, wherein the magnetic objective lens is configured such that the sample is at least substantially isolated from the first magnetic field and from the second magnetic field during operative use of the charged particle microscope system.

15. The charged particle microscope system of claim 13, wherein the lens body comprises:

a first pole piece extending circumferentially around the central bore;

a second pole piece extending circumferentially around the central bore and at least partially disposed radially exteriorly of the first pole piece; and a third pole piece extending circumferentially around the central bore and at least partially disposed radially exteriorly of the second pole piece, wherein the magnetic objective lens is configured such that the first pole piece, the second pole piece, and the third pole piece collectively form a portion of a common magnetic circuit when the first coil generates the first magnetic field and the second coil generates the second magnetic field.

16. The charged particle microscope system of claim 13, wherein the charged particle beam comprises an electron beam, and wherein the charged particle microscope system is configured to operate as a scanning electron microscope (SEM).

17. A method, comprising:

positioning a sample relative to a magnetic lens; and operating the magnetic lens to focus a charged particle beam to a focus location, comprising:

generating, with a first coil of the magnetic lens, a first magnetic field; and generating, with a second coil of the magnetic lens, a second magnetic field, overlapping the first magnetic field to form a total magnetic field that is a sum of the first magnetic field and the second magnetic field, wherein the magnetic lens comprises:

a plurality of pole pieces defining at least two axial gaps; and at least two independent coils in respective communication with the at least two axial gaps such that the magnetic lens operates as a single objective lens with variable main objective plane.

18. The method of claim 17, wherein the positioning the sample comprises positioning the sample fully exteriorly of the magnetic lens, and wherein the operating the magnetic lens comprises generating a magnetic field to focus the charged particle beam without immersing the sample in the magnetic field.

19. The method of claim 17, wherein the operating the magnetic lens comprises:

wherein the operating the magnetic lens comprises adjusting one or both of the first magnetic field and the second magnetic field to vary a magnification of the magnetic lens without varying a working distance between the magnetic lens and the focus location.

20. The method of claim 17, wherein the at least two independent coils comprise a first coil configured to generate a first magnetic field and a second coil configured to generate a second magnetic field, wherein the charged particle beam comprises a plurality of charged particle beamlets, and wherein the operating the magnetic lens comprises:

focusing the plurality of charged particle beamlets to respective focus locations in a focal plane; and adjusting one or both of the first magnetic field and the second magnetic field to vary a pitch of the focused charged particle beamlets at the focal plane without shifting a location of the focal plane.

* * * * *